(12) United States Patent
Usui et al.

(10) Patent No.: US 9,793,911 B2
(45) Date of Patent: Oct. 17, 2017

(54) SEMICONDUCTOR DEVICE INCLUDING ANALOG TO DIGITAL CONVERSION CIRCUIT

(71) Applicant: RENESAS ELECTRONICS CORPORATION, Tokyo (JP)

(72) Inventors: Masaaki Usui, Tokyo (JP); Shunsuke Nakano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/265,048

(22) Filed: Sep. 14, 2016

(65) Prior Publication Data

US 2017/0093419 A1    Mar. 30, 2017

(30) Foreign Application Priority Data

Sep. 25, 2015  (JP) .................................. 2015-188108

(51) Int. Cl.
  *H03M 1/00* (2006.01)
  *H03M 1/12* (2006.01)

(52) U.S. Cl.
  CPC .................................. *H03M 1/1245* (2013.01)

(58) Field of Classification Search
  CPC .................................................... H03M 1/1245
  USPC ................................................. 341/122–155
  See application file for complete search history.

(56) References Cited

U.S. PATENT DOCUMENTS

| | | | | |
|---|---|---|---|---|
| 6,737,850 | B2* | 5/2004 | Kushiyama | G01R 19/16542 324/72 |
| 7,009,537 | B2* | 3/2006 | Kabune | H03M 1/1076 341/118 |
| 7,049,993 | B2* | 5/2006 | Ando | H03M 1/1225 341/155 |
| 7,427,936 | B2* | 9/2008 | Takeuchi | H03M 1/1076 341/118 |
| 7,688,239 | B2* | 3/2010 | Onoda | H03M 1/1076 341/120 |
| 7,830,286 | B2* | 11/2010 | Kabune | H03M 1/0687 341/122 |
| 7,956,789 | B2* | 6/2011 | Ushie | H03M 1/1076 341/120 |
| 2007/0040588 | A1* | 2/2007 | Braswell | G11C 27/026 327/94 |
| 2010/0245141 | A1 | 9/2010 | Ushie | |

* cited by examiner

*Primary Examiner* — Lam T Mai
(74) *Attorney, Agent, or Firm* — McDermott Will & Emery LLP

(57) ABSTRACT

An object of the present invention is to shorten time required for detecting disconnection in an input terminal of an A/D conversion circuit. A semiconductor device includes a first input channel that couples a first input terminal and an A/D conversion unit to each other, a second input channel that couples a second input terminal and the A/D conversion unit to each other, and a control circuit unit that separates the second input channel from the second input terminal and the A/D conversion unit to charge or discharge the second input channel when a signal input into the first input terminal is sampled by the A/D conversion unit.

18 Claims, 28 Drawing Sheets

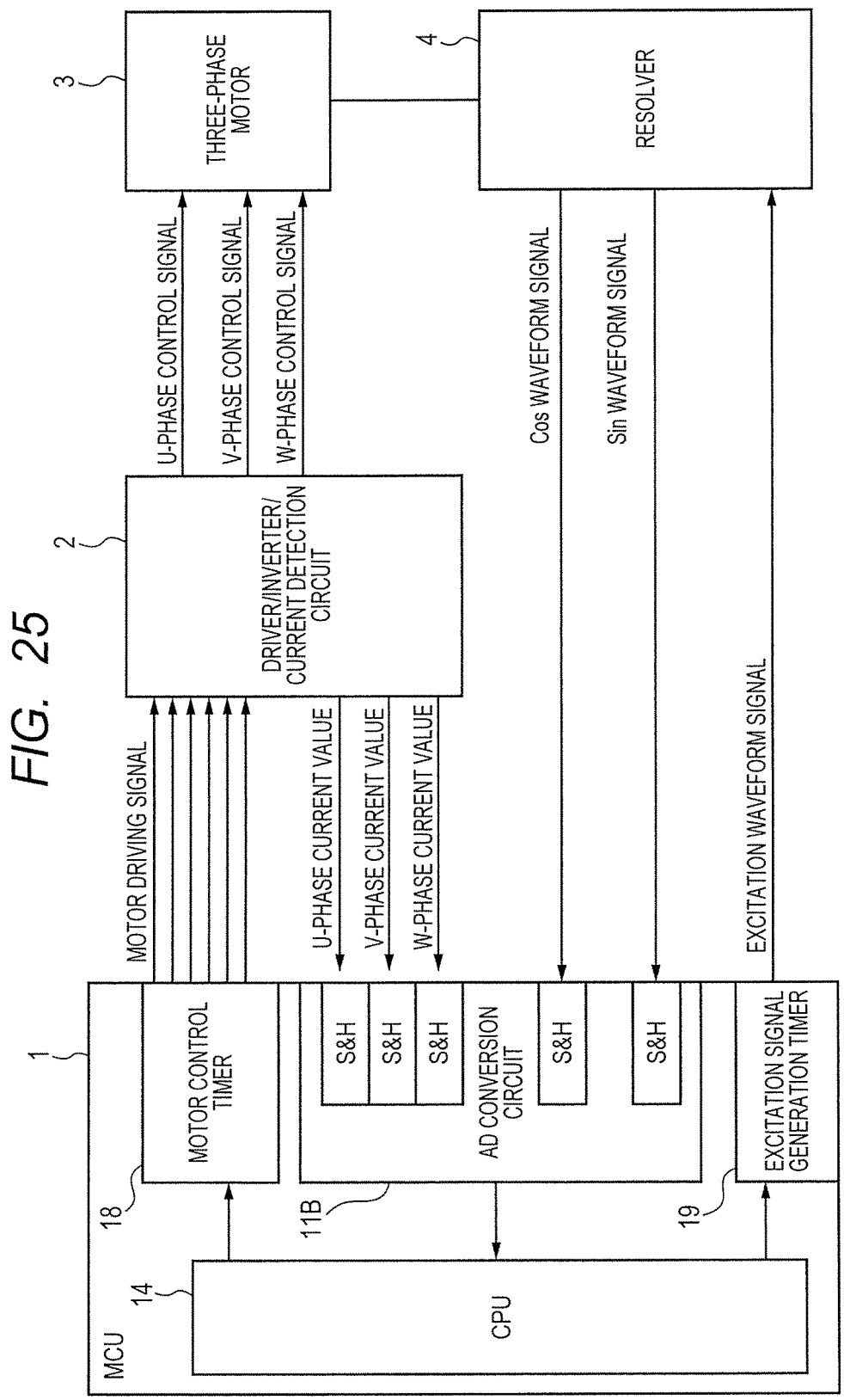

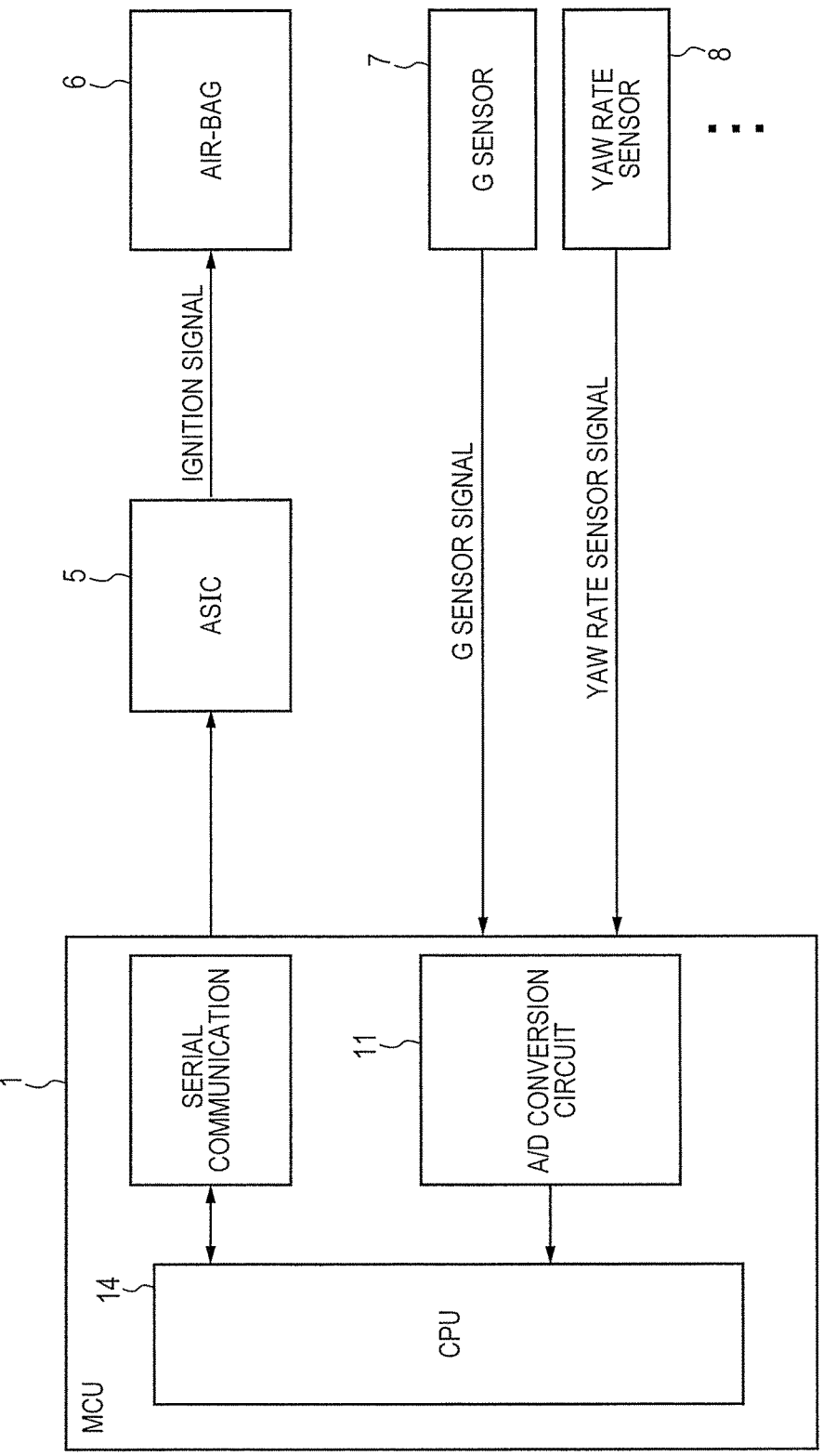

SEMICONDUCTOR DEVICE INCLUDING ANALOG TO DIGITAL CONVERSION CIRCUIT

CROSS-REFERENCE TO RELATED APPLICATIONS

The disclosure of Japanese Patent Application No. 2015-188108 filed on Sep. 25, 2015 including the specification, drawings and abstract is incorporated herein by reference in its entirety.

BACKGROUND

The disclosure relates to a semiconductor device, and can be applied to a semiconductor device including, for example, an A/D conversion circuit.

In the case where a signal from a sensor is fetched to perform a process in accordance with the status of the signal in a semiconductor device such as a microcomputer, an A/D conversion circuit that converts the analog signal from the sensor to a digital signal available in a control circuit is used. A safety function of automatically avoiding a situation related to human life is mounted in automobiles and the like. Such a function is realized by a semiconductor device to which various sensors are coupled. If disconnection occurs in an input signal line of the A/D conversion circuit in such a semiconductor device, a signal from an important sensor is not input, and the semiconductor device cannot detect occurrence of an abnormal situation, resulting in a serious problem that the safety function is not executed when needed. In order to prevent such false determination of the semiconductor device, a technique of reliably detecting the disconnection has been proposed (for example, US Patent Application Publication No. 2010/0245141).

SUMMARY

US Patent Application Publication No. 2010/0245141 describes that disconnection can be detected without being affected by wiring capacitance outside a microcomputer of an input signal unit for A/D conversion. However, electric charges are charged to or discharged from a sample hold capacitor to detect the disconnection, and further A/D conversion is performed in one terminal, at least, twice. Accordingly, time more than twice the normal A/D conversion is required. The other objects and novel features will become apparent from the description of the specification and the accompanying drawings.

The following is a representative summary of the disclosure. Namely, a semiconductor device includes an A/D conversion circuit having a mechanism of charging or discharging, during A/D conversion, parasitic capacitance to/from a terminal in which A/D conversion is not performed.

According to the above-described semiconductor device, it is possible to shorten time required for detecting disconnection.

BRIEF DESCRIPTION OF THE DRAWINGS

FIG. 25 is a block diagram for showing a configuration of a motor control system according to a first application;

FIG. 26 is a block diagram for showing a configuration of an air-bag system according to a second application.

DETAILED DESCRIPTION

Hereinafter, an embodiment, an example, modified examples, and applications will be described using the drawings. However, the same signs are given to the same constitutional elements in the following description, and repeated explanations will be omitted in some cases.

EMBODIMENT

Figure 27:
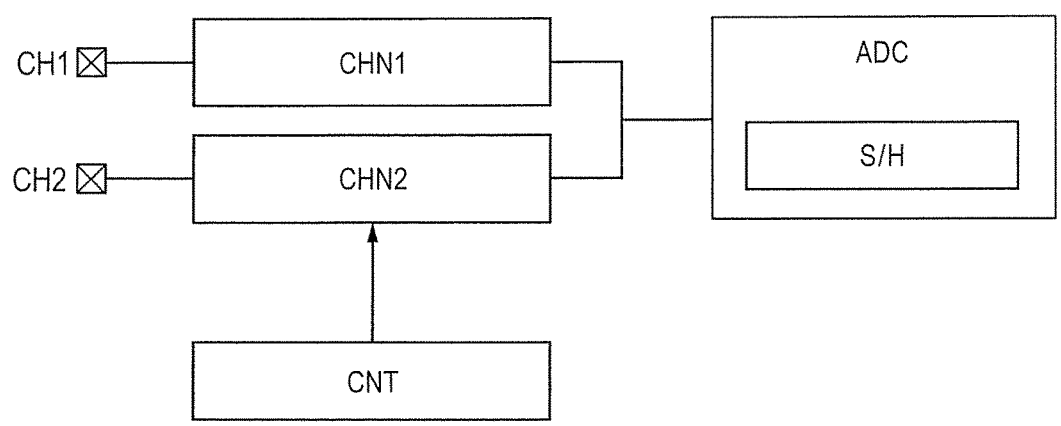
FIG. 27 is a block diagram for showing a configuration of a semiconductor device according to an embodiment.

A configuration of a semiconductor device according to an embodiment will be described using FIG. 27. The semiconductor device according to the embodiment includes a first input terminal (CH1), a second input terminal (CH2), an A/D conversion unit (ADC) having a sample hold circuit (S/H), a first input channel (CHN1) that couples the first input terminal (CH1) to the A/D conversion unit (ADC), a second input channel (CHN2) that couples the second input terminal (CH2) to the A/D conversion unit (ADC), and a control unit (CNT). When a signal input into the first input terminal (CH1) is sampled by the sample hold circuit (S/H), the control unit (CNT) separates the second input channel (CHN2) from the second input terminal (CH2) and the A/D conversion unit (ADC) to charge or discharge the second input channel (CHN2).

According to the embodiment, since an unselected input channel is charged or discharged, disconnection can be detected by A/D conversion when the input channel is selected. Further, if disconnection is not detected, the A/D conversion result is obtained by normal A/D conversion. Thus, it is not necessary to perform A/D conversion for detecting disconnection that is different from normal A/D conversion. In other words, disconnection can be detected during normal A/D conversion.

EXAMPLE

Figure 1:
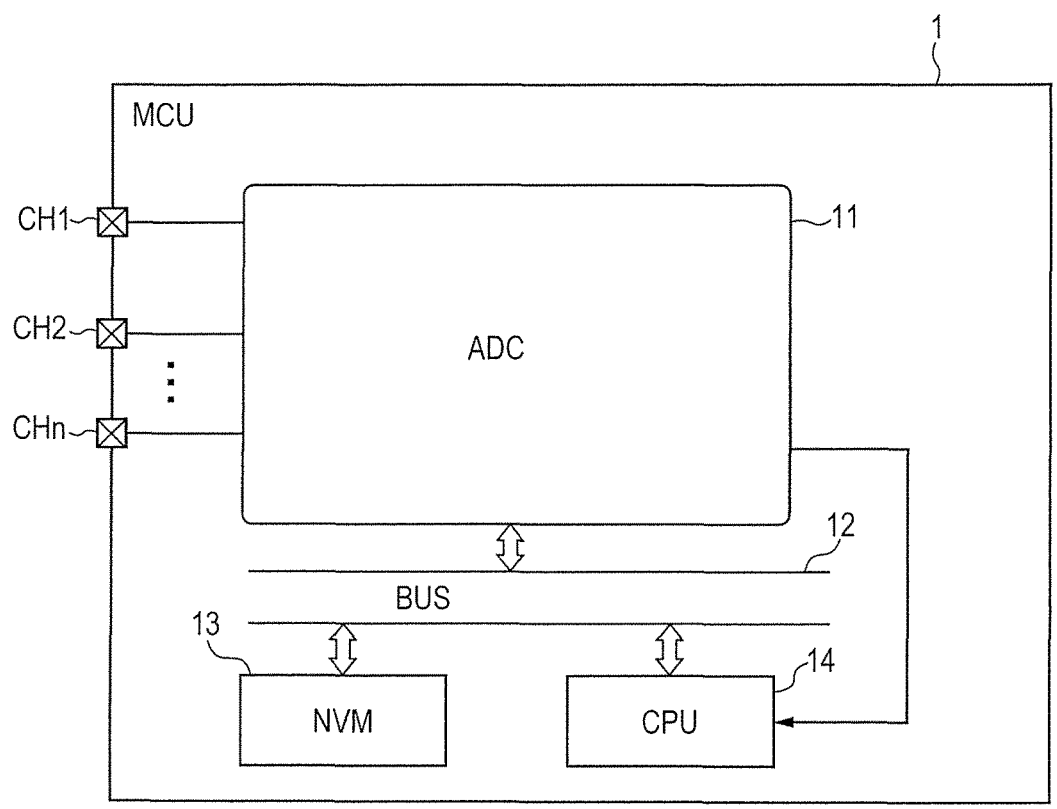
FIG. 1 is a block diagram for showing a configuration of a semiconductor device according to an example.

A configuration of a semiconductor device according to an example will be described using FIGS. 1 to 3. As shown in FIG. 1, a microcontroller (MCU) 1 that is a semiconductor device includes, on a semiconductor substrate, an A/D conversion circuit (ADC) 11, an internal bus (BUS) 12, an electrically-erasable or electrically-writable nonvolatile memory (NVM) 13 such as a flash memory, and a central processing unit (CPU) 14. On the basis of a program read from the nonvolatile memory 13 through the internal bus (BUS) 12, the CPU 14 controls the A/D conversion circuit 11 through the internal bus 12 to read an A/D conversion result through the internal bus 12. A signal output from a signal generation source such as a sensor is input into input terminals CH1 to CHn coupled to the A/D conversion circuit 11.

Figure 2:
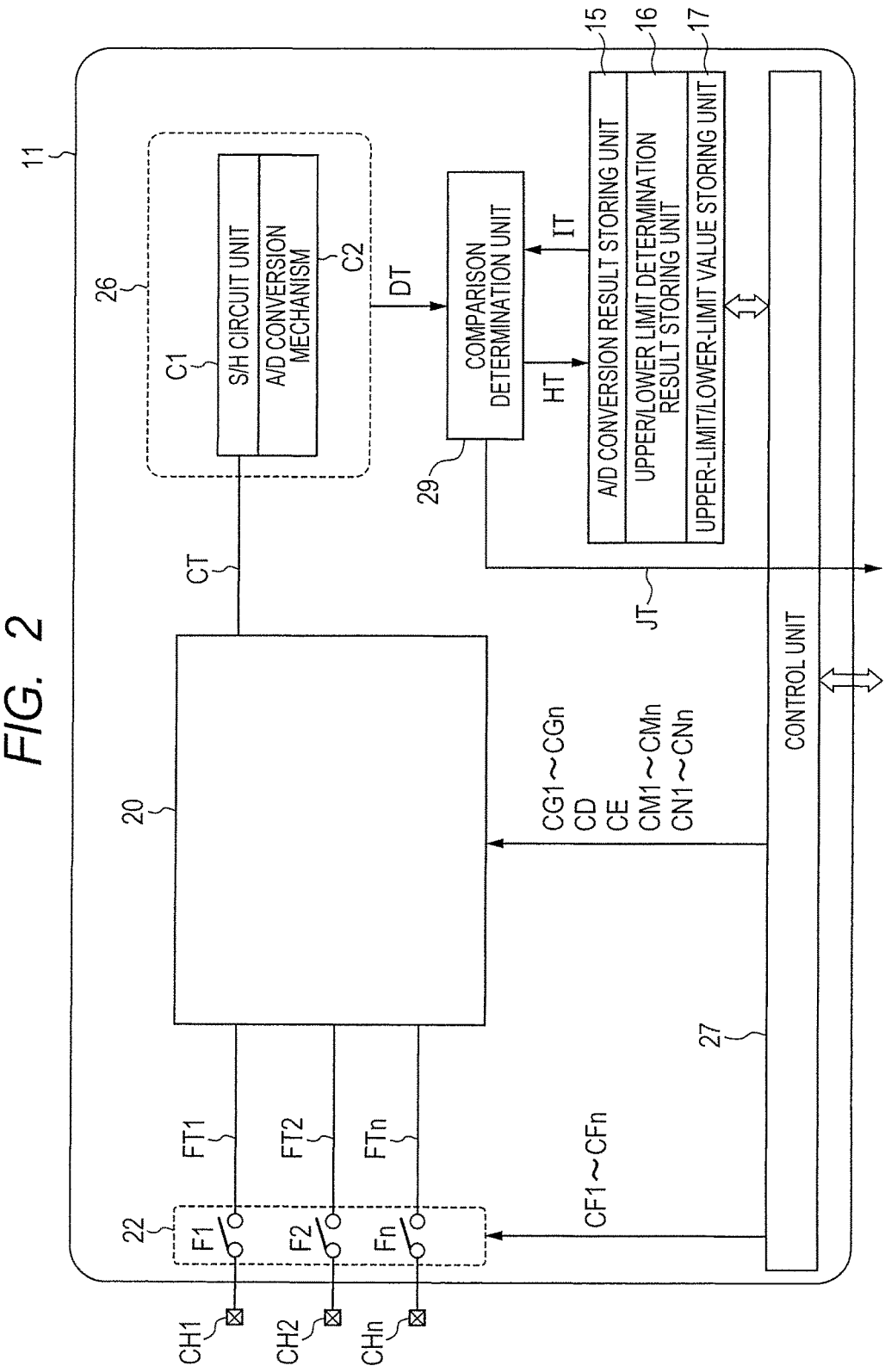
FIG. 2 is a block diagram for showing a configuration of an A/D conversion circuit of FIG. 1.

As shown in FIG. 2, the A/D conversion circuit 11 includes an input signal selection unit 22, an input unit 20, an A/D conversion unit 26, a control unit 27, and a comparison determination unit 29. The A/D conversion circuit 11 further includes an A/D conversion result storing unit 15, an upper/lower limit determination result storing unit 16, and an upper-limit/lower-limit value storing unit 17 that are coupled to the internal bus 12 through the control unit 27 and are configured using memories and registers from/into which data can be read and written by the CPU 14.

The input signal selection unit 22 allows input signal selection switches F1 to Fn to selectively output signals input through the input terminals CH1 to CHn to input signal lines FT1 to FTn. The input signal lines FT1 to FTn are coupled to the input unit 20. The input signal selection unit 22 needs to select a target input terminal when A/D conversion is performed. Thus, the number of input signal selection switches F1 to Fn is the same as that of input terminals CH1 to CHn. These input signal selection switches F1 to Fn are controlled by control signals (CF1 to CFn) from the control unit 27.

Figure 3:
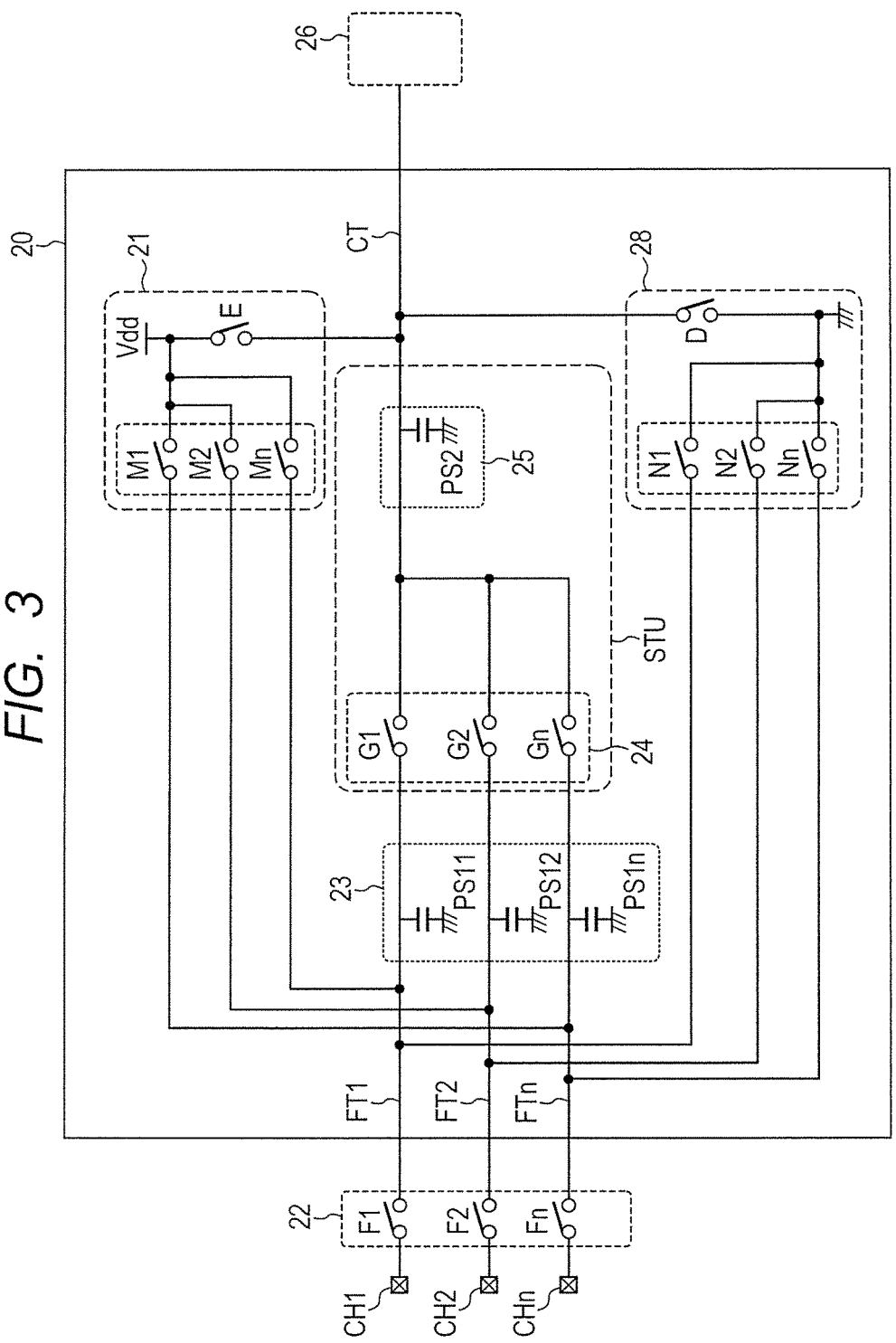
FIG. 3 is a circuit diagram for showing a configuration of an input unit of FIG. 2.

As shown in FIG. 3, the input unit 20 includes a charge unit 21, a parasitic capacitance unit 23, a signal transmission unit STU, and a discharge unit 28. In the charge unit 21, the input signal lines FT1 to FTn are coupled to a power supply line (Vdd) through charge control switches M1 to Mn, and an output signal line CT is coupled to the power supply line (Vdd) through a charge switch E. Opening/closing of the charge control switches M1 to Mn and the charge switch E is controlled by control signals (CM1 to CMn and CE) output from the control unit 27. In the discharge unit 28, the input signal lines FT1 to FTn are coupled to a grounding wire through discharge control switches N1 to Nn, and the output signal line CT is coupled to the grounding wire through a discharge switch D. Opening/closing of the discharge control switches N1 to Nn and the discharge switch D is controlled by control signals (CN1 to CNn and CD) output from the control unit 27. The parasitic capacitance unit 23 includes capacitors PS11 to PS1$n$ that are parasitic capacitances between the input signal lines FT1 to FTn and the grounding wire.

The signal transmission unit STU includes a switch unit 24 and a parasitic capacitance unit 25. In the switch unit 24, the input signal lines FT1 to FTn are coupled to the output signal line CT through switches G1 to Gn. Opening/closing of the switches G1 to Gn is controlled by control signals (CG1 to CGn) output from the control unit 27. The parasitic capacitance unit 25 includes a capacitor PS2 that is a parasitic capacitance between the output signal line CT and the grounding wire.

Routes from the input terminals CH1 to CHn to the output signal line CT through the input signal selection switches F1 to Fn, the input signal lines FT1 to FTn, and the switches G1 to Gn are referred to as a first input channel to an n-th input channel, respectively. When the n-th input channel is selected, an output signal of a signal generation source coupled to the input terminal CHn is fetched to the A/D conversion unit 26. Outputs of the first input channel to the n-th input channel are bound to the output signal line CT, and thus only one of the first input channel to the n-th input channel is selected.

As shown in FIG. 2, the A/D conversion unit 26 has a sample hold (S/H) circuit unit C1 that holds electric charges of the output signal line CT and an A/D conversion mechanism C2 that performs A/D conversion for the held electric charges, and outputs an A/D conversion result (DT) to the comparison determination unit 29. The comparison determination unit 29 compares the A/D conversion result (DT) output from the A/D conversion unit 26 with upper/lower limit data (IT) output from the upper-limit/lower-limit value storing unit 17, and stores the result into the upper/lower limit determination result storing unit 16 as an upper/lower limit determination result (HT). When the comparison result is determined as disconnection, the result is notified to the CPU 14 as an interruption request signal (JT). Further, the comparison determination unit 29 stores the A/D conversion result (DT) into the A/D conversion result storing unit 15.

An operation of the A/D conversion circuit of FIG. 2 will be described using FIGS. 4, 5, 6A, and 6B. The switching control of the A/D conversion circuit differs depending on the input terminal (selected input channel) in which A/D conversion is performed and the input terminal (unselected input channel) in which A/D conversion is not performed. The input channels are the first input channel to the n-th input channel, but the n-th input channel will be described below as a representative channel.

When a signal of the input terminal CHn is A/D converted, the control unit 27 puts the input signal selection switch Fn in a conductive state, and puts the input signal selection switches other than the input signal selection switch Fn in a non-conductive state.

Figure 4:
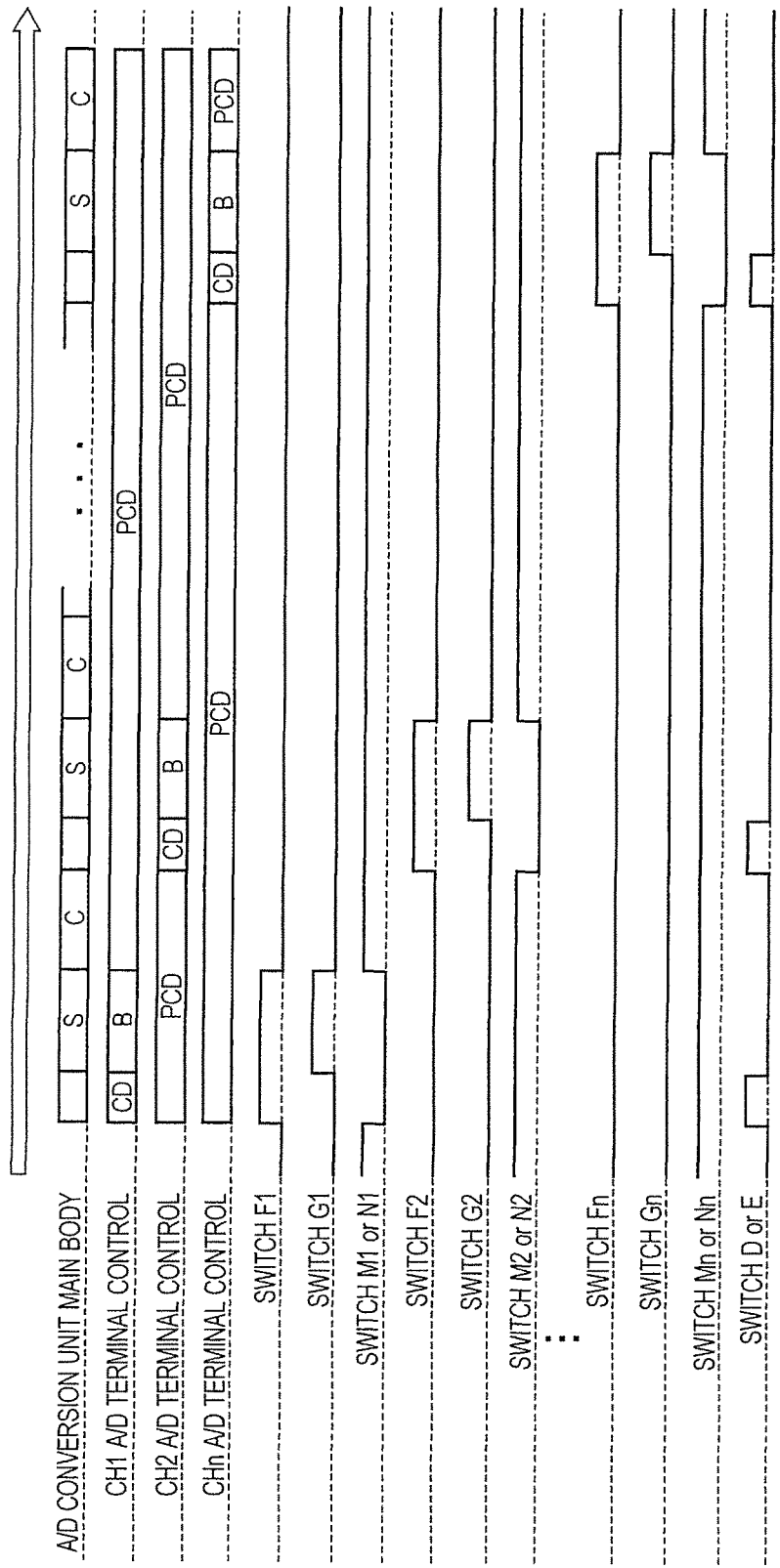
FIG. 4 is a timing diagram of the A/D conversion circuit of FIG. 2.
Figure 6A:
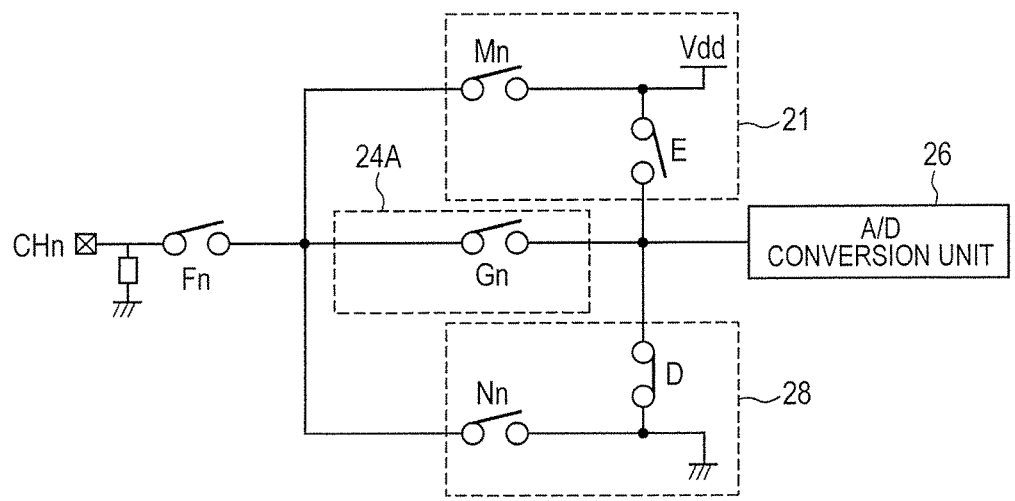
FIG. 6A is a diagram for explaining switch control of an unselected input channel (period CD) of FIG. 3.

In a period CD of FIG. 4, in order to suppress the influence of the electric charges when A/D conversion is performed at a different terminal before the electric charges of the signal generation source are charged to the S/H circuit unit C1, the control unit 27 puts the discharge switch D in a conductive state before A/D conversion to discharge the electric charges from the S/H circuit unit C1 and the parasitic capacitance unit 25 as shown in FIG. 6A. The control unit 27 puts the switches other than the discharge switch D in a non-conductive state. A case in which the electric charges are discharged will be mainly described below. However, the same control is performed even in the case where the electric charges are charged. The charging or discharging can be selected on an input channel basis. The period CD corresponds to the charging or discharging period of the S/H circuit unit C1.

Figure 5:
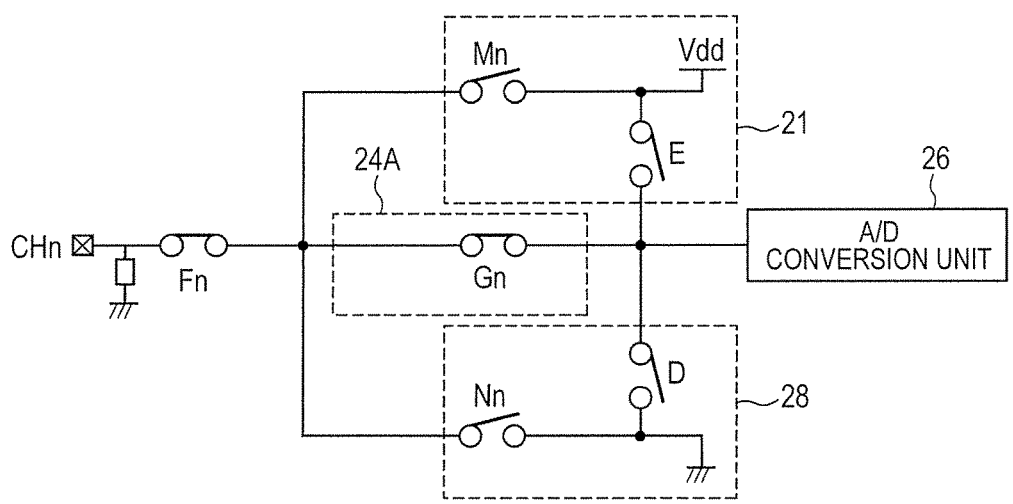
FIG. 5 is a diagram for explaining switch control of a selected input channel of FIG. 3.

In a period B of FIG. 4, after the electric charges are discharged from the S/H circuit unit C1, the control unit 27 charges the electric charges to the S/H circuit unit C1 by putting the switch Gn in a conductive state as shown in FIG. 5. The control unit 27 puts each switch of the charge unit 21 and the discharge unit 28 in a non-conductive state. The period B corresponds to the sampling period of the S/H circuit unit C1 (period S).

In a period C of FIG. 4, after the charging of the electric charges of the signal generation source to the S/H circuit unit C1 is completed, the control unit 27 performs A/D conversion by putting the switch Gn in a non-conductive state. The period C corresponds to the conversion period of the A/D conversion unit 26.

Figure 6B:
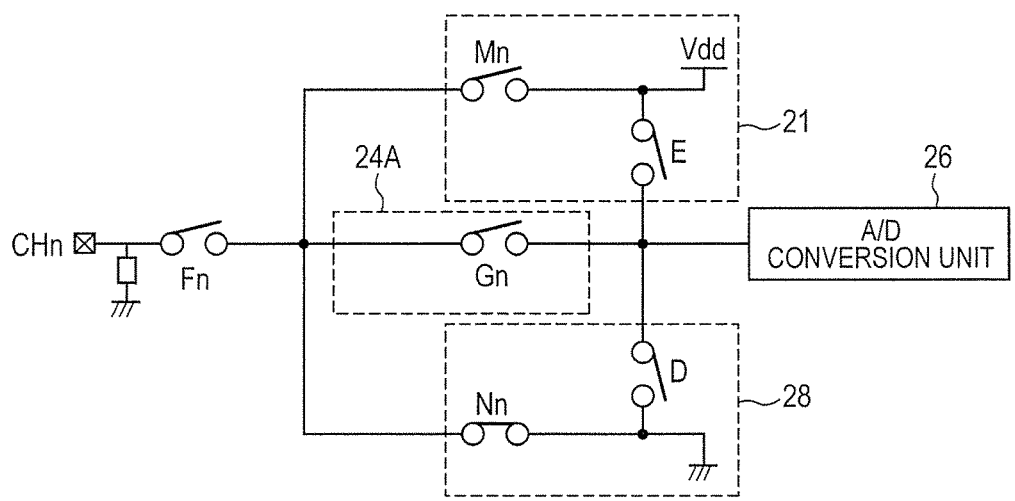
FIG. 6B is a diagram for explaining switch control of the unselected input channel (period PCD) of FIG. 3.

In the case where a signal of the input terminal CHn is not A/D converted, when the charging of the electric charges to the S/H circuit unit C1 is determined on the basis of the lower limit to detect disconnection, the control unit 27 puts the input signal selection switch Fn in a non-conductive state, puts the switch Gn in a non-conductive state, and puts the discharge control switch Nn in a conductive state to discharge the electric charges charged to the parasitic capacitance unit 23 (capacitor PS1n) in a period PCD of FIG. 4 as shown in FIG. 6B. Namely, the control unit 27 puts the switches other than the discharge control switch Nn in a non-conductive state. The period PCD corresponds to the discharging or charging period of the input signal line FTn. When the input terminal CHn is in a disconnection state, the electric charges are discharged from the parasitic capacitance unit 23 (capacitor PS1n) to discharge the electric charges from the input signal line FTn to the A/D conversion unit 26 when A/D conversion is performed. Accordingly, the comparison determination unit 29 determines that the A/D conversion result becomes around 0V, and the disconnection state is detected.

In the case where a signal of the input terminal CHn is not A/D converted, when the charging of the electric charges to the S/H circuit unit C1 is determined on the basis of the upper limit to detect disconnection, the switch Gn is put in a non-conductive state, and the charge control switch Mn is put in a conductive state to charge the electric charges to the parasitic capacitance unit 23 in the period PCD of FIG. 4. Namely, the control unit 27 puts the switches other than the charge control switch Mn in a non-conductive state. When the input terminal CHn is in a disconnection state, the electric charges are charged to the parasitic capacitance unit 23 to charge the electric charges from the input signal line FTn to the A/D conversion unit 26 when A/D conversion is performed. Accordingly, the comparison determination unit 29 determines that the A/D conversion result becomes around a power supply voltage (for example, 5V), and the disconnection state is detected.

The A/D conversion result of 0V or 5V relative to a sensor input voltage (for example, 0.15V to 4.85V) can be obtained. Thus, the disconnection detection is determined by setting, for example, the lower-limit value data stored in the upper-limit/lower-limit value storing unit to 0.1V between 0 and 0.15V and by setting the upper-limit value data to 4.9V between 4.85 and 5V. When an input from each selected input channel has a normal value (for example, 3V), the electric charges corresponding to 3V are accumulated in the S/H circuit unit C1 to perform A/D conversion, and the A/D conversion result of 3V can be obtained. However, when there is a disconnection abnormality in an input terminal, no electric charges are accumulated in the S/H circuit unit C1. Thus, the electric charges accumulated in the S/H circuit unit C1 remain in the state (0V or 5V) in which the S/H circuit unit C1 is initialized. If A/D conversion is performed in this case, the conversion result of 0V or 5V can be obtained, and the comparison determination unit 29 can determine as disconnection. It should be noted that the upper/lower limit data (IT) is set in accordance with the input voltage range of the sensor, and is not limited to the above-described values.

In each input channel, the period CD, the period B, and the period PCD are periodically repeated in order. The period CD and the period B of one input channel are performed in parallel with the period PCD of a different input channel. In other words, A/D conversion of a signal input into one input channel is performed in parallel with the charging or discharging of a different input channel.

According to the example, a mechanism of charging or discharging the parasitic capacitance during A/D conversion is added to the terminal (input channel) in which A/D conversion is not performed, and thus disconnection can be detected by one A/D conversion. Further, disconnection can be detected during normal A/D conversion.

It should be noted that when the control signal for a switch is of a high level, the switch is put in a conductive state. When the control signal for a switch is of a low level, the switch is put in a non-conductive state. The discharge switch D and the charge switch E are controlled on an input channel basis, and are not simultaneously put in a conductive state. The charge control switch Mn is valid when the charge switch E is controlled, and the discharge control switch Nn is valid when the discharge switch D is controlled. When the switches are invalid, the switches are always put in a non-conductive state. The same applies to the following first to third modified examples.

First Modified Example

Figure 7:
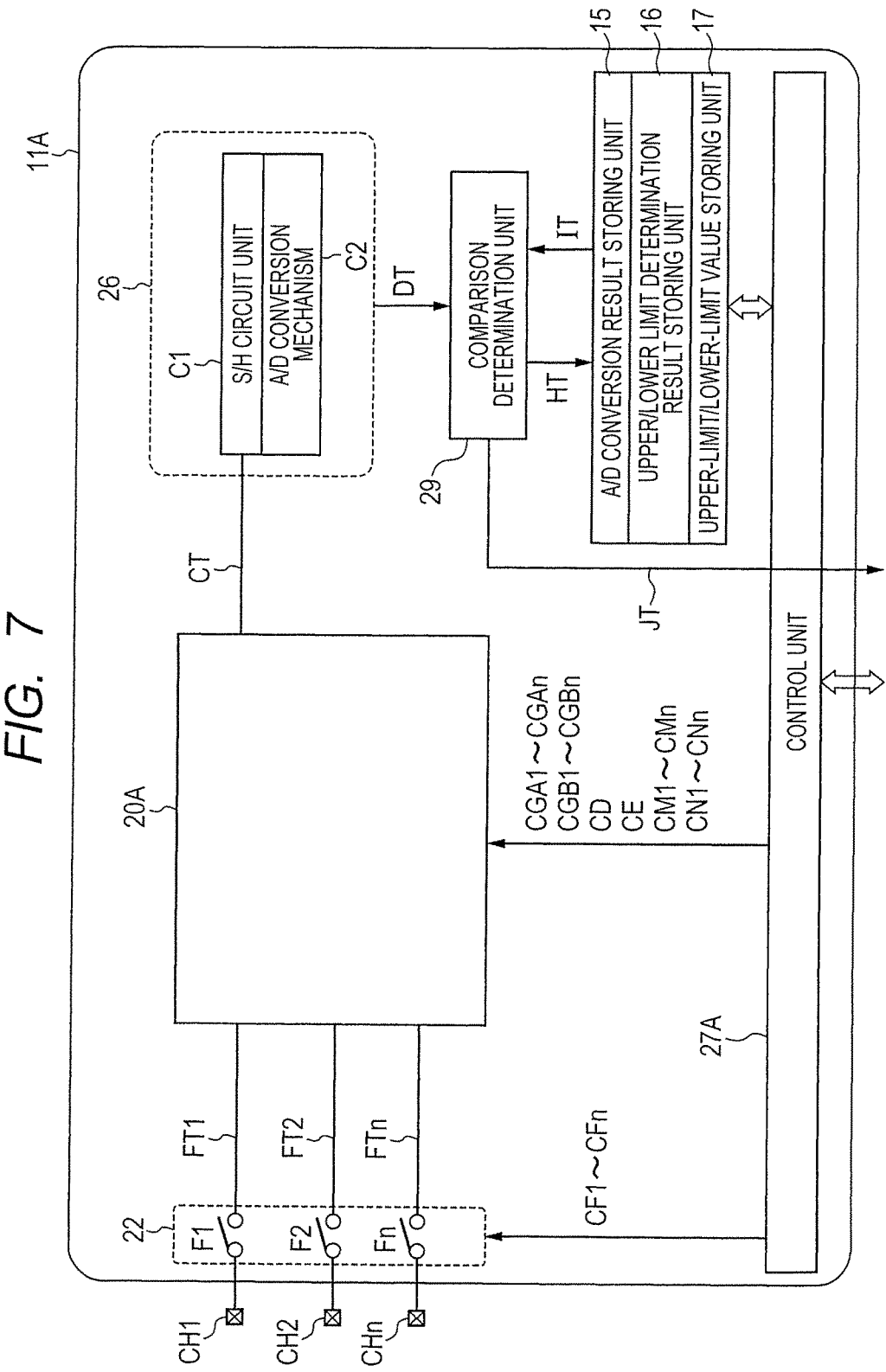
FIG. 7 is a block diagram for showing a configuration of an A/D conversion circuit according to a first modified example.
Figure 8:
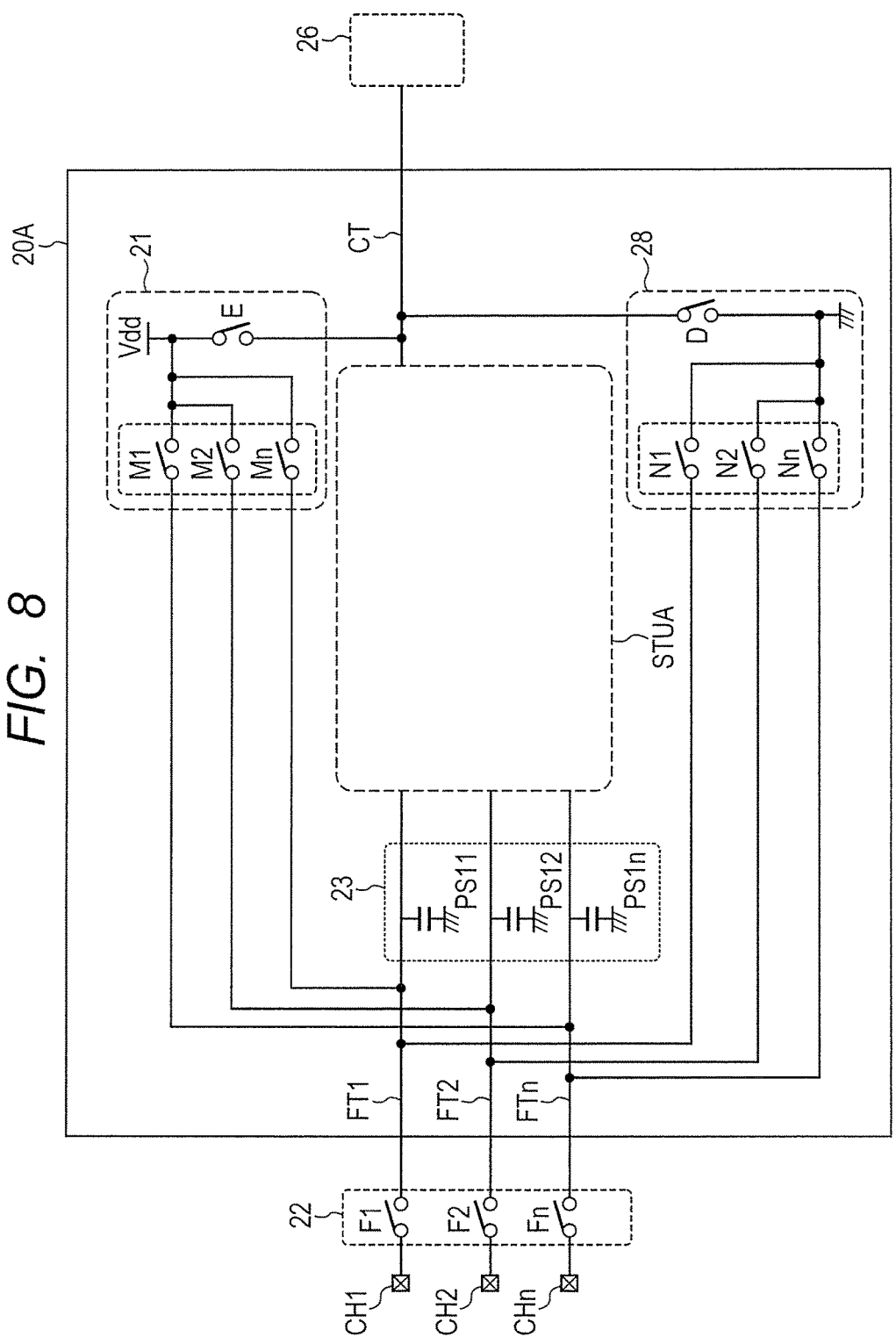
FIG. 8 is a circuit diagram for showing a configuration of an input unit of FIG. 7.

A configuration of an A/D conversion circuit according to a first modified example of the example will be described using FIGS. 7 to 9. As shown in FIG. 7, an A/D conversion circuit 11A according to the first modified example has the same configuration as the example except for a signal transmission unit STUA and a control unit 27A. As shown in FIG. 8, an input unit 20A according to the first modified example is obtained by replacing the signal transmission unit STU of FIG. 3 with the signal transmission unit STUA of FIG. 9.

Figure 9:
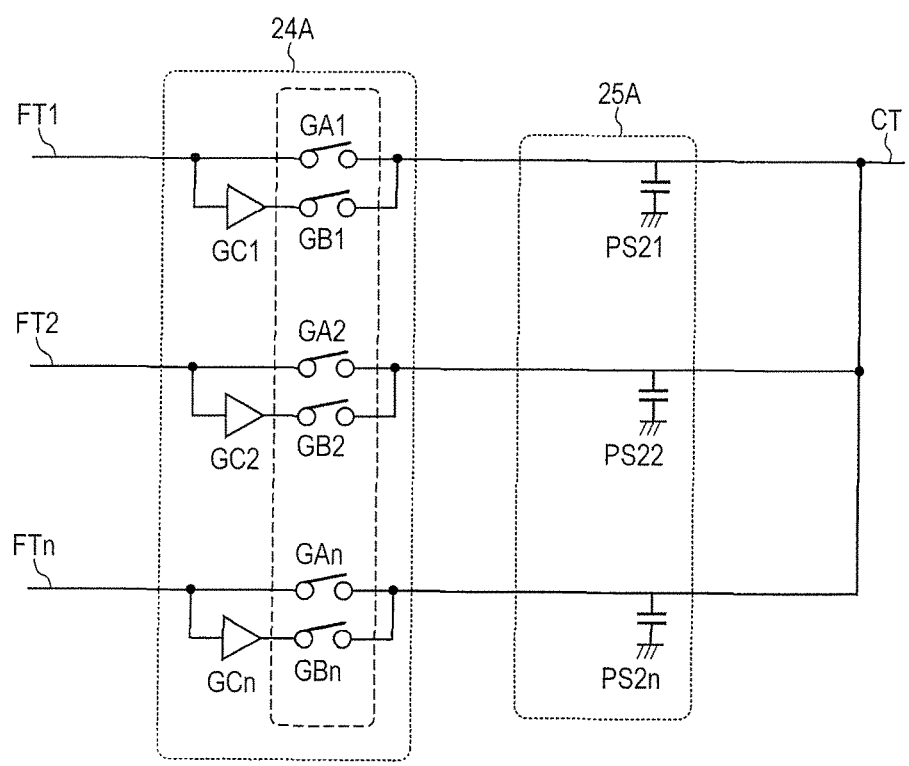
FIG. 9 is a circuit diagram for showing a configuration of a signal transmission unit of FIG. 8.

As shown in FIG. 9, the signal transmission unit STUA includes a bypass/amplifying unit 24A and a parasitic capacitance unit 25A. The bypass/amplifying unit 24A includes bypass switches GA1 to GAn that couple input signal lines FT1 to FTn to an output signal line CT not through amplifiers GC1 to GCn, and amplifier switches GB1 to GBn that couple the input signal lines FT1 to FTn to the output signal line CT through the amplifiers GC1 to GCn. Opening/closing of the bypass switches GA1 to GAn and the amplifier switches GB1 to GBn is controlled by control signals (CGA1 to CGAn and CGB1 to CGBn) output from the control unit 27A. The parasitic capacitance unit 25A includes capacitors PS21 to PS2n that are parasitic capacitances between the output signal line CT and a grounding wire. A route from the input terminal CHn to the output signal line CT through the input signal selection switch Fn, the input signal line FTn, and the bypass switch GAn (the amplifier GCn and the amplifier switch GBn) is referred to as an n-th input channel.

An operation of the A/D conversion circuit of FIG. 7 will be described using FIGS. 10, 11A, 11B, 12A, and 12B. As similar to the example, the switching control of the A/D conversion circuit differs depending on the input terminal (selected input channel) in which A/D conversion is performed and the input terminal (unselected input channel) in which A/D conversion is not performed. The input channels are the first input channel to the n-th input channel, but the n-th input channel will be described below as a representative channel.

When a signal of the input terminal CHn is A/D converted, the control unit 27A puts the input signal selection switch Fn in a conductive state, and puts the input signal selection switches other than the input signal selection switch Fn in a non-conductive state.

Figure 10:
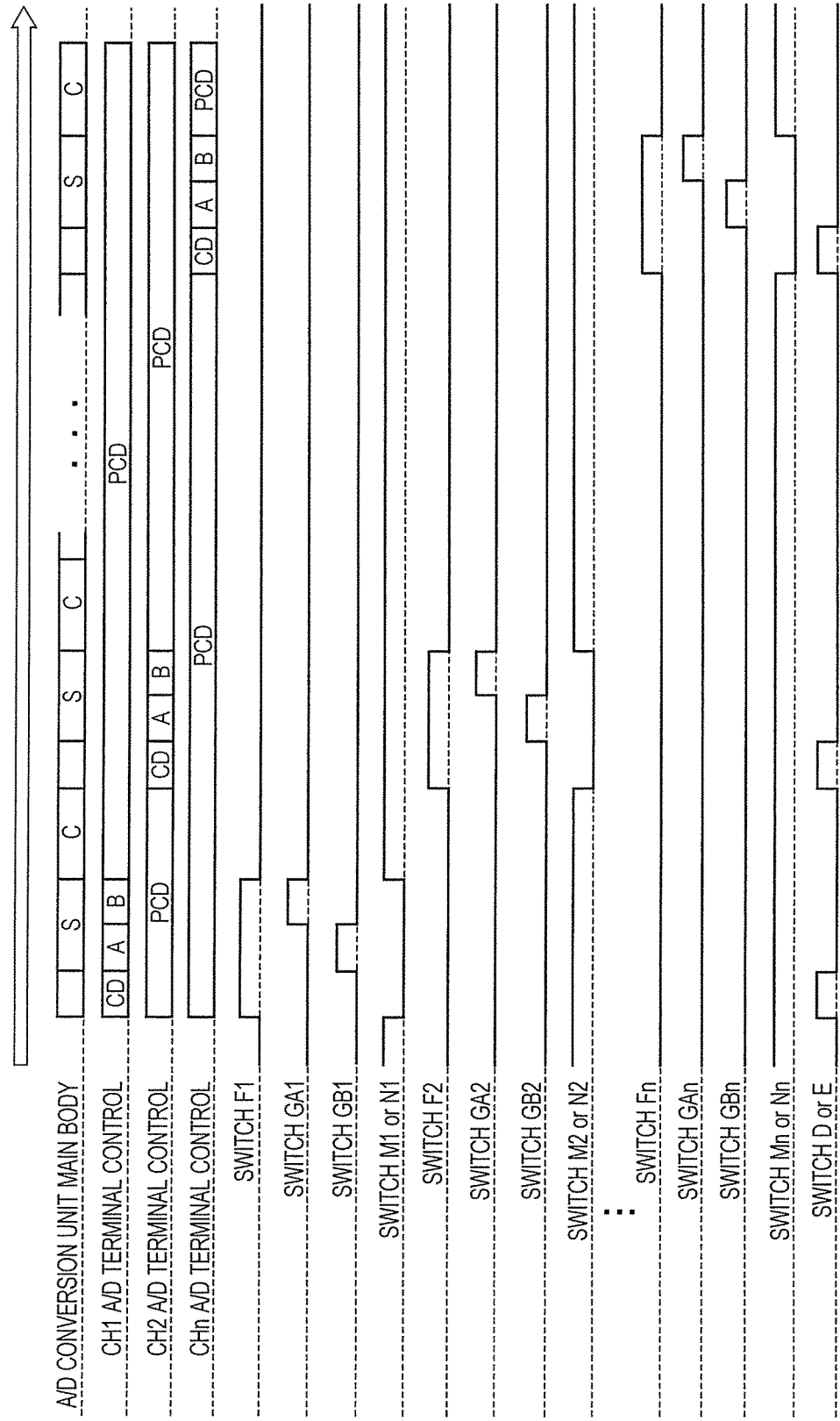
FIG. 10 is a timing diagram of the A/D conversion circuit of FIG. 7.
Figure 12A:
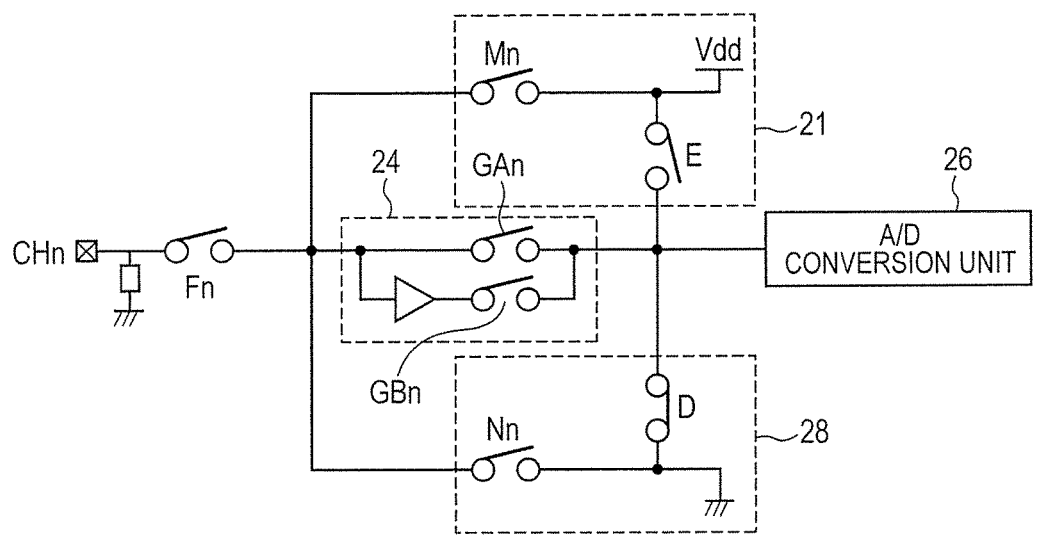
FIG. 12A is a diagram for explaining switch control of an unselected input channel (period CD) of FIG. 9.

In a period CD of FIG. 10, in order to suppress the influence of the electric charges when A/D conversion is performed at a different terminal before the electric charges of the signal generation source are charged to the S/H circuit unit C1, the control unit 27A puts the discharge switch D in a conductive state before A/D conversion to discharge the electric charges from the S/H circuit unit C1 and the parasitic capacitance unit 25A as shown in FIG. 12A. The control unit 27A puts the switches other than the discharge switch D in a non-conductive state. A case in which the electric charges are discharged will be mainly described below. However, the same control is performed even in the case where the electric charges are charged. The period CD corresponds to the charging or discharging period of the S/H circuit unit C1.

Figure 11A:
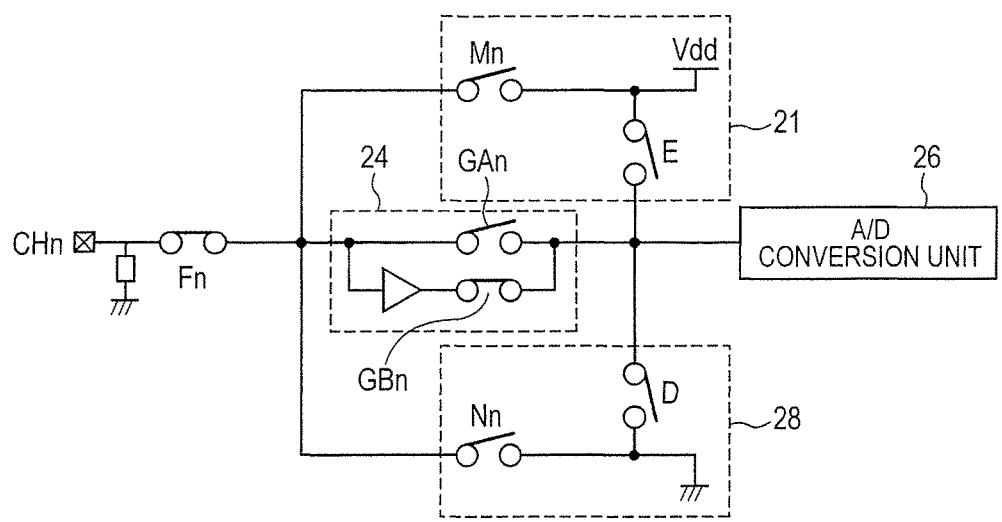
FIG. 11A is a diagram for explaining switch control of a selected input channel (period A) of FIG. 9.

In a period A of FIG. 10, after the electric charges are discharged from the S/H circuit unit C1, the control unit 27A puts the switch GBn in a conductive state to charge the electric charges of the signal generation source to the S/H circuit unit C1 using an output from the amplifier GCn as shown in FIG. 11A. The control unit 27A puts each switch of the charge unit 21 and the discharge unit 28 in a non-conductive state.

Figure 11B:
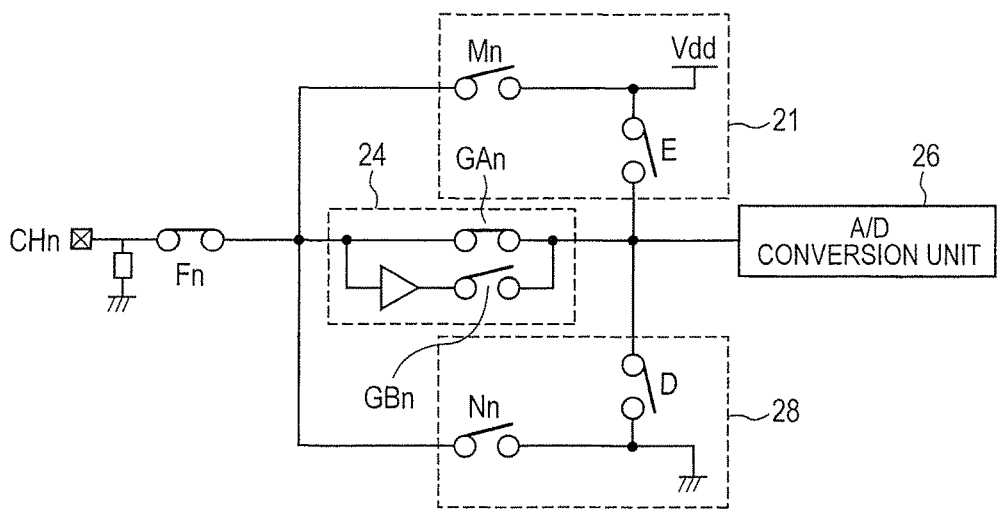
FIG. 11B is a diagram for explaining switch control of the selected input channel (period B) of FIG. 9.

In a period B of FIG. 10, in order to improve the accuracy of A/D conversion, the control unit 27A puts the amplifier switch GBn in a non-conductive state, and puts the bypass switch GAn in a conductive state to charge the electric charges of the signal generation source to the S/H circuit unit C1 as shown in FIG. 11B. The control unit 27A puts each switch of the charge unit 21 and the discharge unit 28 in a non-conductive state. The period A and the period B correspond to the sampling period of the S/H circuit unit C1 (period S).

In a period C of FIG. 10, after the charging of the electric charges of the signal generation source to the S/H circuit unit C1 is completed, the control unit 27A performs A/D conversion by putting the bypass switch GAn in a non-conductive state. The period C corresponds to the conversion period of the A/D conversion unit 26.

Figure 12B:
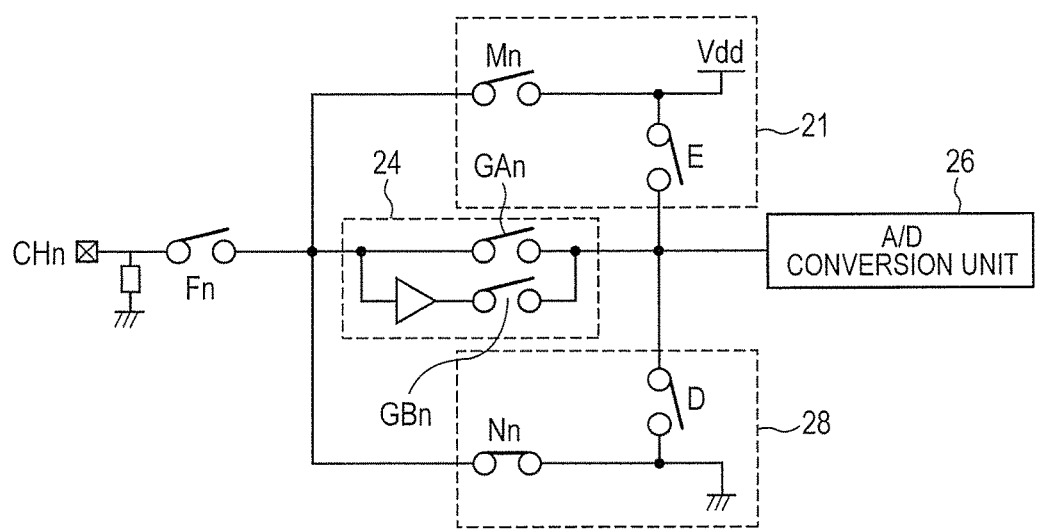
FIG. 12B is a diagram for explaining switch control of the unselected input channel (period PCD) of FIG. 9.

A case in which a signal of the input terminal CHn is not A/D converted and the charging of the electric charges to the S/H circuit unit C1 is determined on the basis of the lower limit to detect disconnection will be described. The control unit 27A puts the input signal selection switch Fn in a non-conductive state, puts the bypass switch GAn and the amplifier switch GBn in a non-conductive state, and puts the discharge control switch Nn in a conductive state to discharge the electric charges charged to the parasitic capacitance unit 23 (capacitor PS1n) in a period PCD of FIG. 10 as shown in FIG. 12B. Namely, the control unit 27A puts the switches other than the discharge control switch Nn in a non-conductive state. The period PCD corresponds to the discharging or charging period of the input signal line FTn. When the input terminal CHn is in a disconnection state, the electric charges are discharged from the parasitic capacitance unit 23 (capacitor PS1n) to discharge the electric charges from the input signal line FTn to the A/D conversion unit 26 when A/D conversion is performed. Accordingly, the comparison determination unit 29 determines that the A/D conversion result becomes around 0V, and the disconnection state is detected.

A case in which a signal of the input terminal CHn is not A/D converted and the charging of the electric charges to the S/H circuit unit C1 is determined on the basis of the upper limit to detect disconnection will be described. The control unit 27A puts the bypass switch GAn and the amplifier switch GBn in a non-conductive state, and puts the charge control switch Mn in a conductive state to charge the electric charges to the parasitic capacitance unit 23 (capacitor PS1n) in the period PCD of FIG. 10. Namely, the control unit 27 puts the switches other than the charge control switch Mn in a non-conductive state. When the input terminal CHn is in a disconnection state, the electric charges are charged to the parasitic capacitance unit 23 to charge the electric charges from the input signal line FTn to the A/D conversion unit 26 when A/D conversion is performed. Accordingly, the comparison determination unit 29 determines that the A/D conversion result becomes around a power supply voltage (for example, 5V), and the disconnection state is detected.

In each input channel, the period CD, the period A, the period B, and the period PCD are periodically repeated in order. The period CD, the period A, and the period B of one input channel are performed in parallel with the period PCD of a different input channel. In other words, A/D conversion of a signal input into one input channel is performed in parallel with the charging or discharging of a different input channel.

According to the first modified example, a disconnection state can be detected as similar to the example even when the amplifier is used for the input unit of the A/D conversion circuit.

Second Modified Example

A configuration of an A/D conversion circuit according to a second modified example of the example will be described using FIGS. 13 to 15. The second modified example is configured in such a manner that an S/H circuit (terminal S/H circuit) provided on an input terminal (input channel) basis and a bypass/terminal S/H circuit unit are added to the signal transmission unit of the first modified example. The bypass/terminal S/H circuit unit includes a switch that selects a route bypassing the terminal S/H circuit and the terminal S/H circuit.

Figure 13:
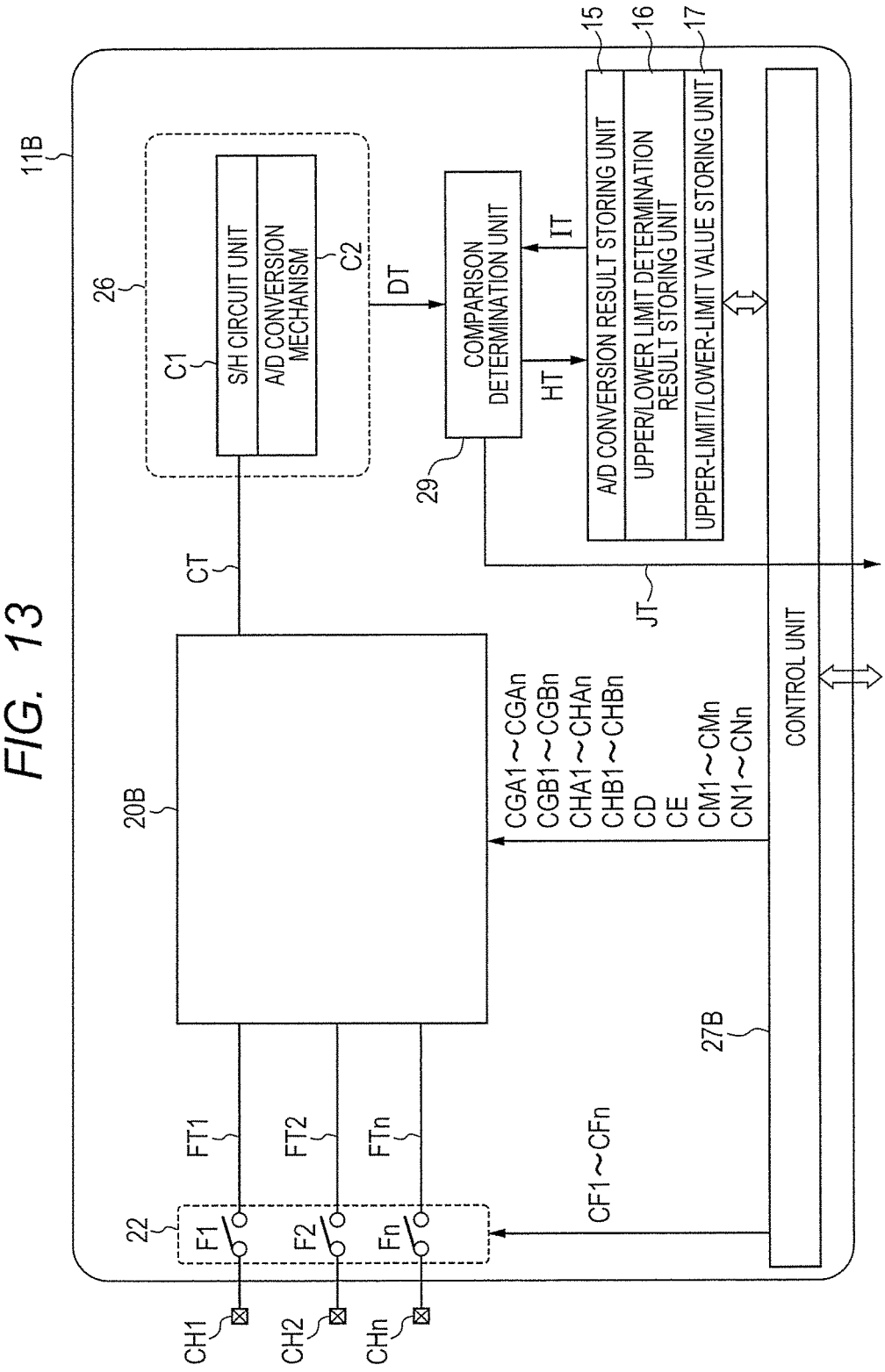
FIG. 13 is a block diagram for showing a configuration of an A/D conversion circuit according to a second modified example.
Figure 14:
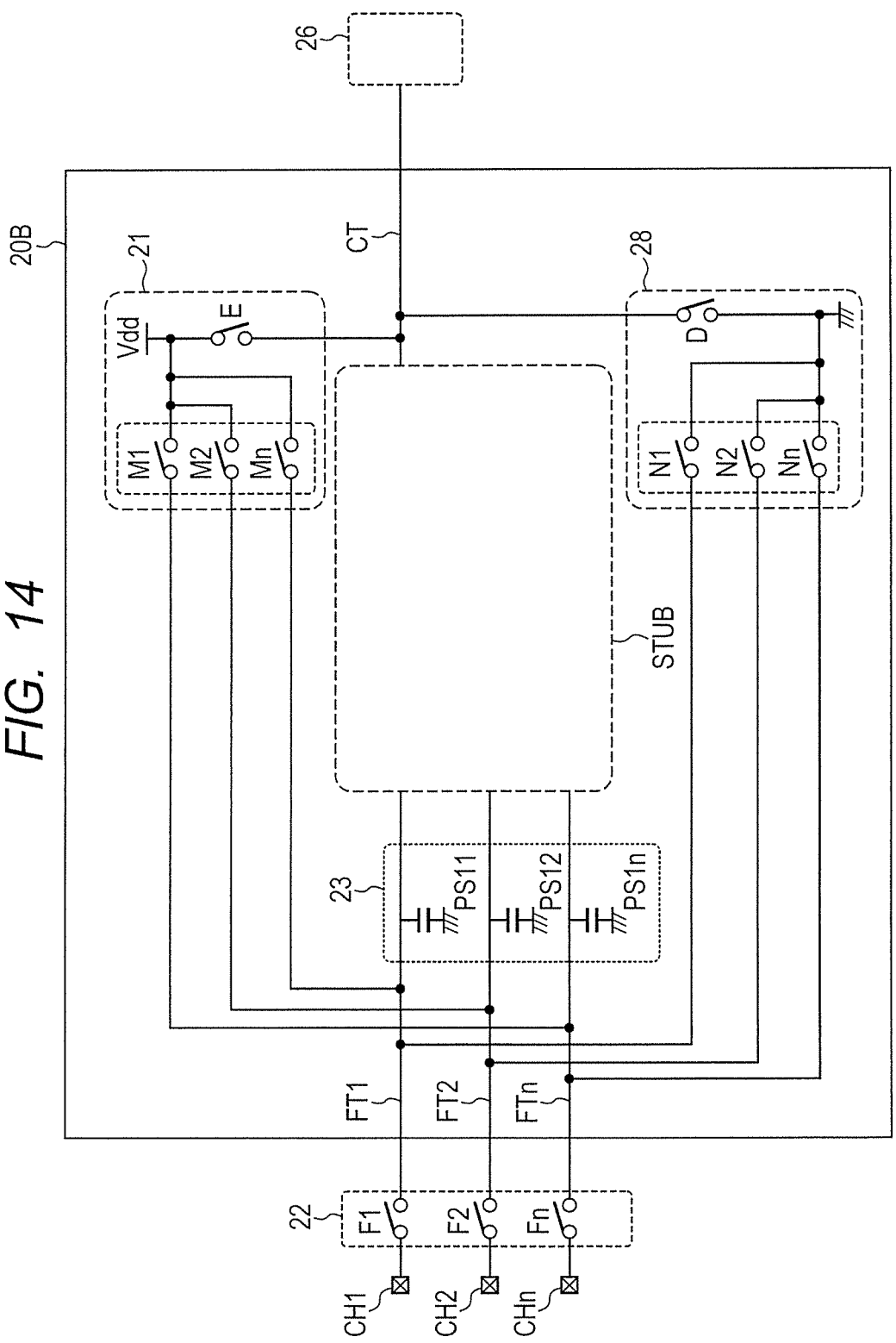
FIG. 14 is a circuit diagram for showing a configuration of an input unit of FIG. 13.

As shown in FIG. 13, an A/D conversion circuit 11B according to the second modified example has the same configuration as the example except for a signal transmission unit STUB and a control unit 27B. As shown in FIG. 14, an input unit 20B according to the second modified example is obtained by replacing the signal transmission unit STU of FIG. 3 with the signal transmission unit STUB of FIG. 15.

Figure 15:
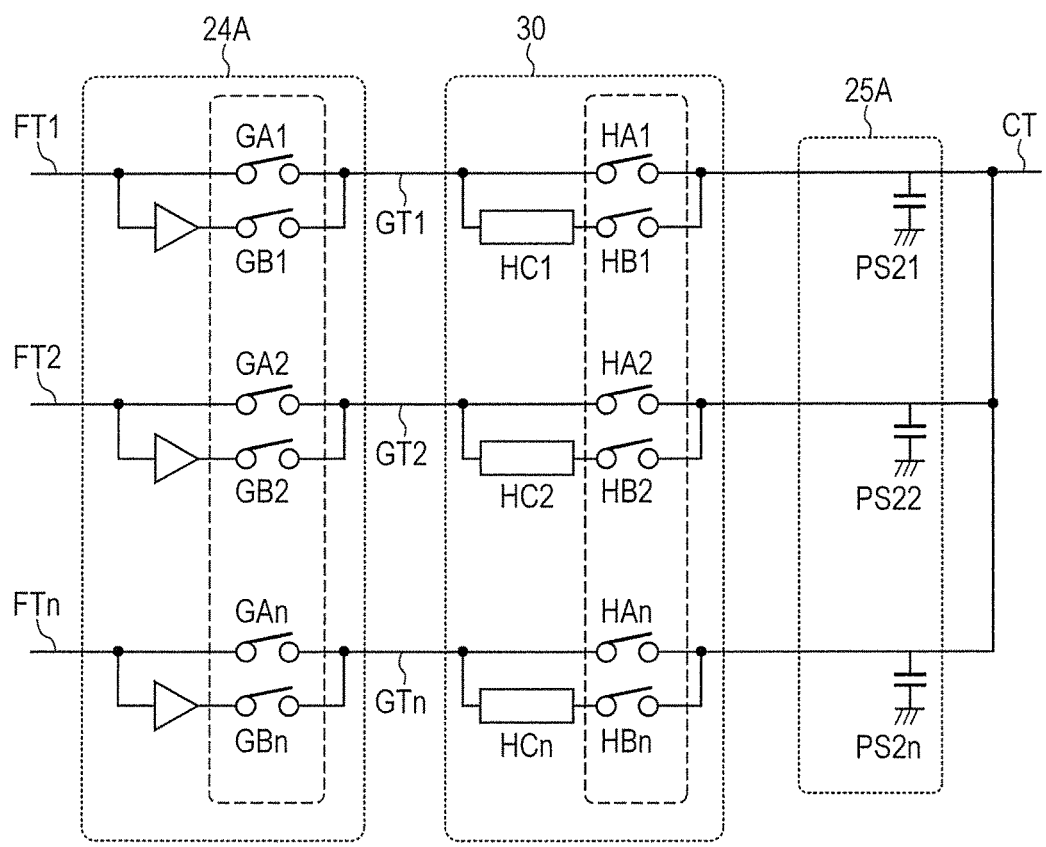
FIG. 15 is a circuit diagram for showing a configuration of a signal transmission unit of FIG. 14.

As shown in FIG. 15, the signal transmission unit STUB includes a bypass/amplifying unit 24A, a terminal S/H circuit unit 30, and a parasitic capacitance unit 25A. The bypass/terminal S/H circuit unit 30 includes bypass switches HA1 to HAn that couple intermediate signal lines GT1 to GTn of the bypass/amplifying unit 24A to an output signal line CT not through terminal S/H circuits HC1 to HCn, and S/H switches HB1 to HBn that couple the intermediate signal lines GT1 to GTn to the output signal line CT through the terminal S/H circuits HC1 to HCn. Opening/closing of the bypass switches HA1 to HAn and the S/H switches HB1 to HBn is controlled by control signals (CHA1 to CHAn and CHB1 to CHBn) output from the control unit 27B. A route from the input terminal CHn to the output signal line CT through the input signal selection switch Fn, the input signal line FTn, the bypass switch GAn (or the amplifier GCn and the amplifier switch GBn), and the bypass switch HAn (or the terminal S/H circuit HCn and the S/H switch HBn) is referred to as an n-th input channel.

In the second modified example, the bypass/terminal S/H circuit unit is added to the first modified example. However, an additional circuit for discharging the electric charges of the terminal S/H circuit or for charging the electric charges to the terminal S/H circuit is not provided, but switching control is added to charge or discharge the electric charges.

An operation of the A/D conversion circuit of FIG. 13 will be described using FIGS. 16, 17A, 17B, 17C, 18A, and 18B. As similar to the example, the switching control of the A/D conversion circuit differs depending on the input terminal (selected input channel) in which A/D conversion is performed and the input terminal (unselected input channel) in which A/D conversion is not performed. The input channels are the first input channel to the n-th input channel, but the n-th input channel will be described below as a representative channel.

Figure 16:
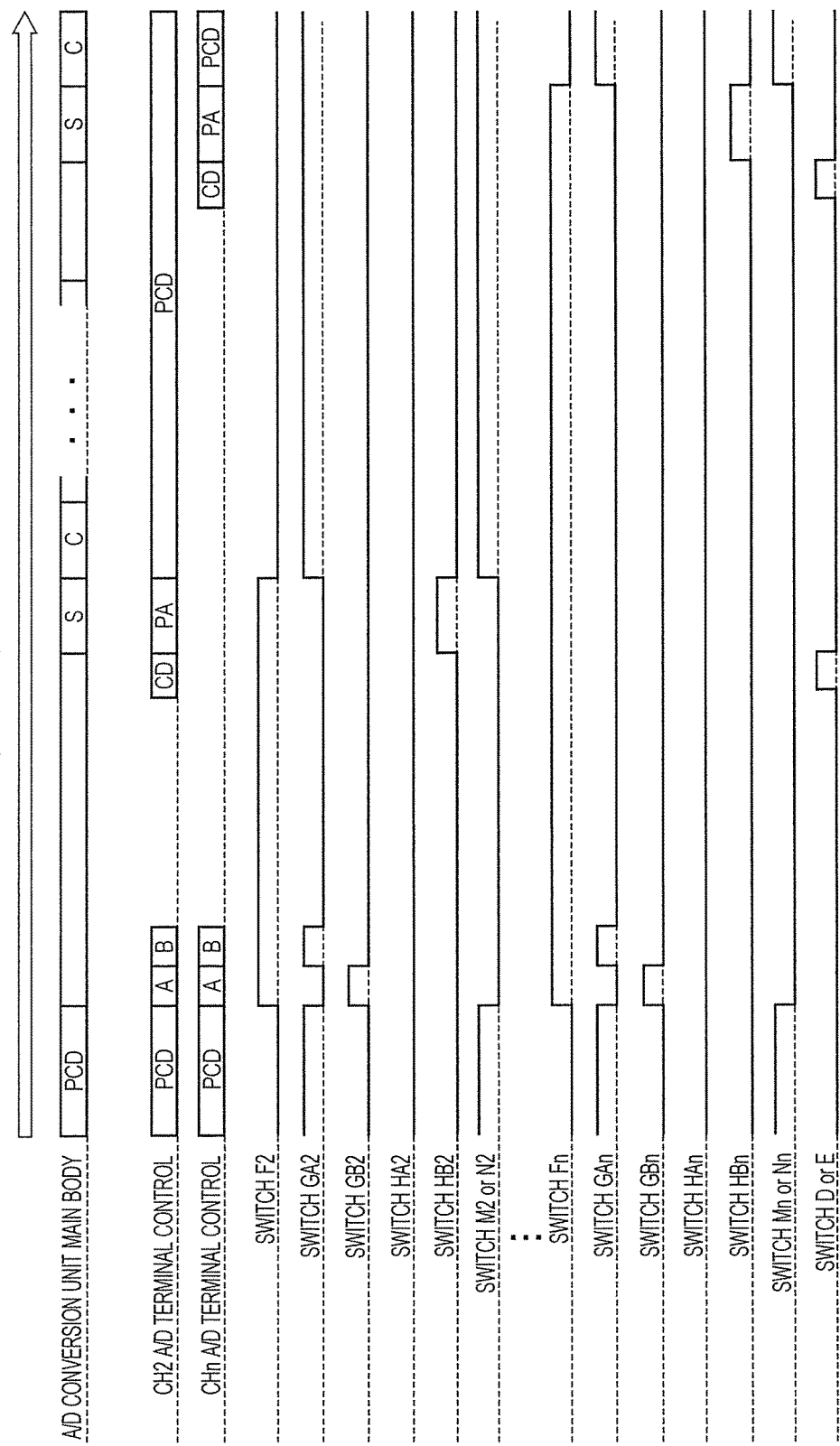
FIG. 16 is a timing diagram of the A/D conversion circuit of FIG. 13.
Figure 17A:
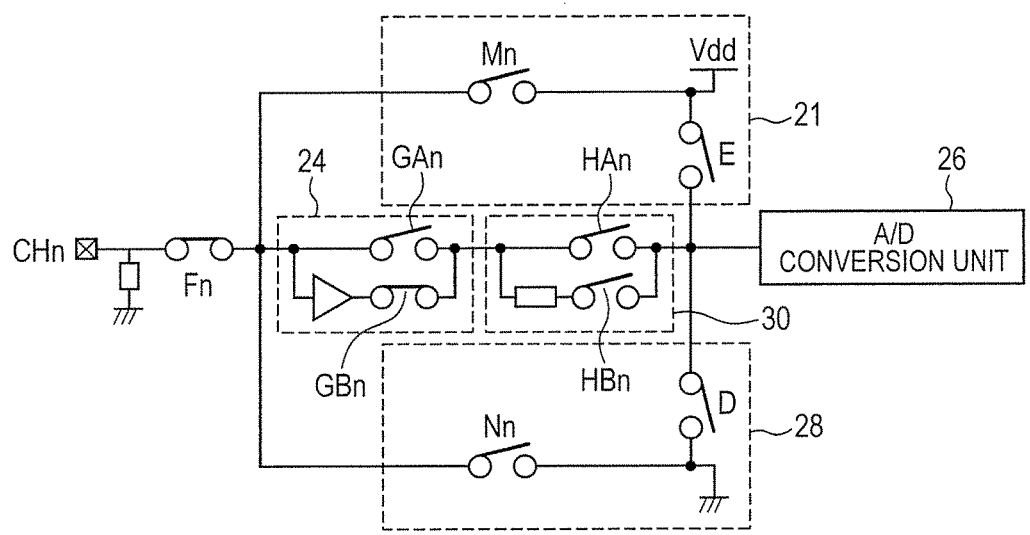
FIG. 17A is a diagram for explaining switch control of a selected input channel (period A) of FIG. 15.
Figure 17B:
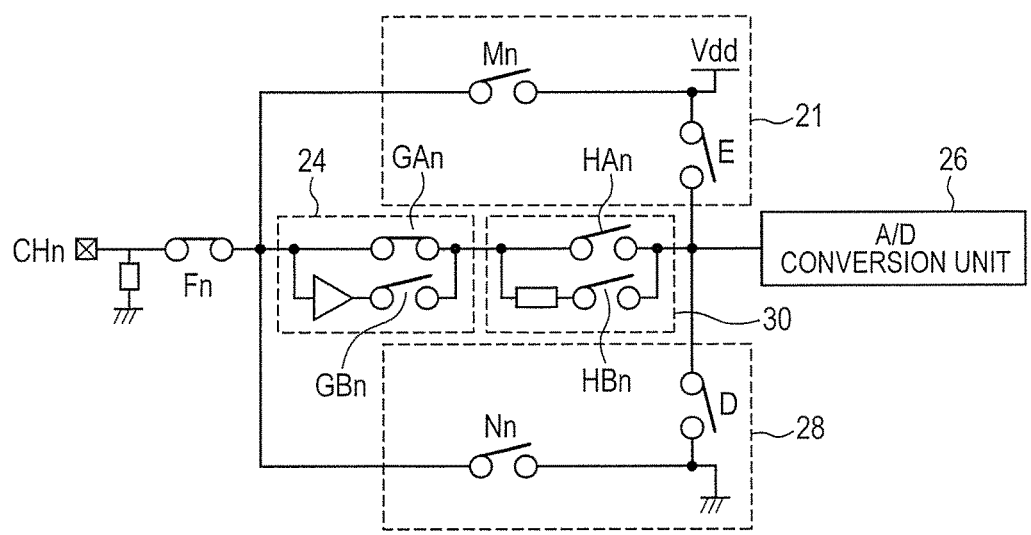
FIG. 17B is a diagram for explaining switch control of the selected input channel (period B) of FIG. 15.

In the switching control, the input signal selection switch Fn of the terminal in which A/D conversion is performed is put in a conductive state, and the control unit 27B charges the electric charges of the signal generation source to the S/H circuit HCn of the terminal S/H circuit unit 30 by controlling the bypass switch GAn and the amplifier switch GBn in a period A and a period B of FIG. 16 as similar to the first modified example as shown in FIGS. 17A and 17B. In this case, the control unit 27B puts each switch of the charge unit 21, the discharge unit 28, and the terminal S/H circuit unit 30 in a non-conductive state. The period A and the period B correspond to the sampling period of the terminal S/H circuit unit 30 unlike the first modified example. After the charging of the electric charges to the terminal S/H circuit unit 30 is completed, the control unit 27B puts the bypass switch GAn and the amplifier switch GBn in a non-conductive state, and allows the terminal S/H circuit HCn to hold the sensor input signal.

Figure 18A:
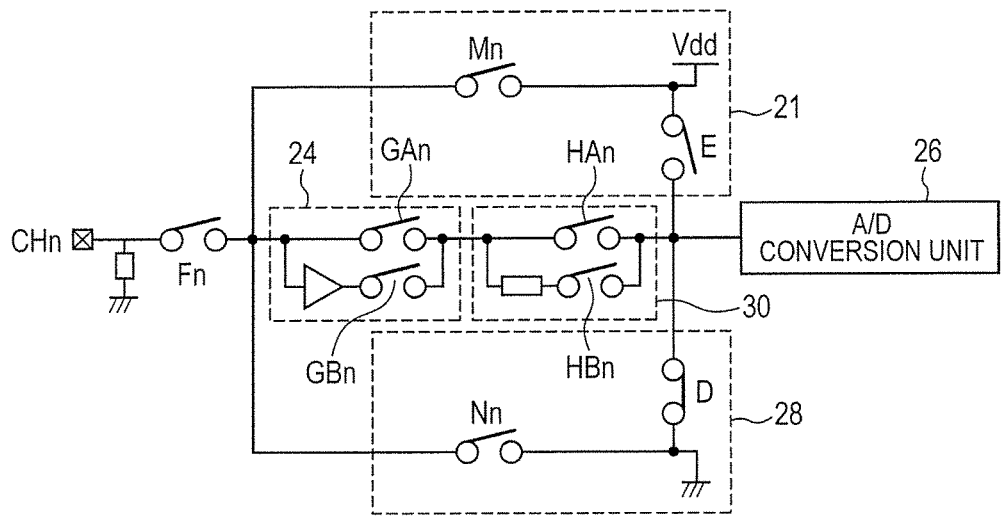
FIG. 18A is a diagram for explaining switch control of an unselected input channel (period CD) of FIG. 15.

In a period CD of FIG. 16, the control unit 27B puts the discharge switch D in a conductive state to discharge the electric charges from the S/H circuit unit C1 and the parasitic capacitance unit 25 before A/D conversion is performed as similar to the example as shown in FIG. 18A. A case in which the electric charges are discharged will be mainly described below. However, the same control is performed even in the case where the electric charges are charged. The period CD corresponds to the charging or discharging period of the S/H circuit unit C1 as similar to the example and the first modified example.

Figure 17C:
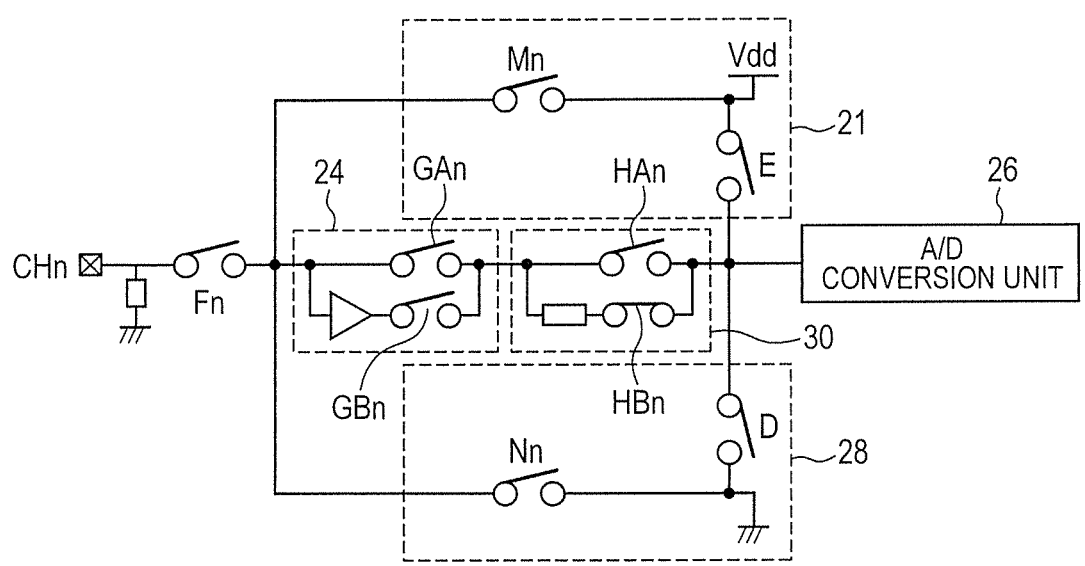
FIG. 17C is a diagram for explaining switch control of the selected input channel (period PA) of FIG. 15.

In a period PA of FIG. 16, the control unit 27B puts the discharge switch D in a non-conductive state, puts the input signal selection switch Fn in a non-conductive state, and puts the S/H switch HBn in a conducive state to charge the electric charges of the S/H circuit HCn to the S/H circuit unit C1 as shown in FIG. 17C. Namely, the control unit 27B puts the switches other than the S/H switch HBn in a non-conductive state. The period PA corresponds to the sampling period of the S/H circuit unit C1 (period S).

In a period C of FIG. 16, the control unit 27B puts the S/H switch HBn in a non-conductive state to complete the charging of the electric charges to the S/H circuit unit C1, and A/D conversion is performed by putting the bypass switch HAn in a non-conductive state. The period C corresponds to the conversion period of the A/D conversion unit 26.

Figure 18B:
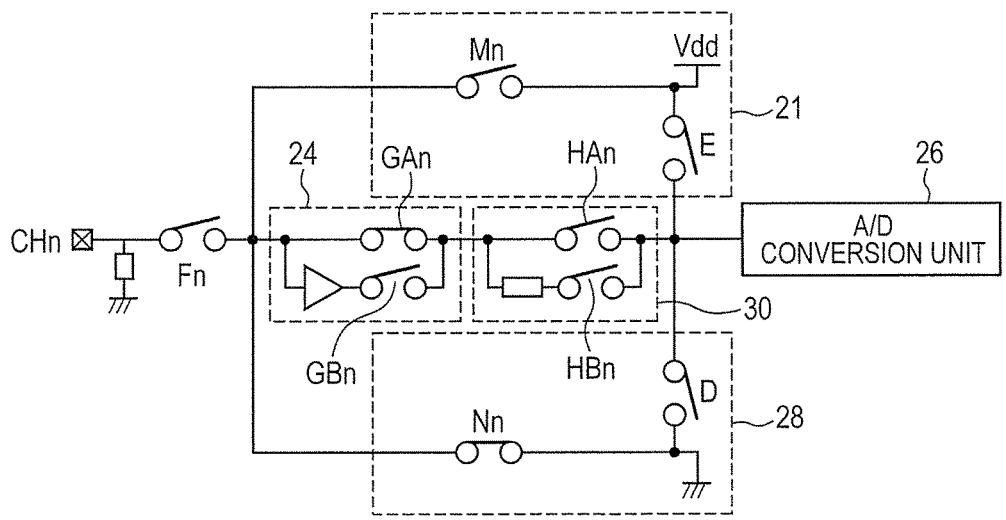
FIG. 18B is a diagram for explaining switch control of the unselected input channel (period PCD) of FIG. 15.

A case in which a signal of the input terminal CHn is not A/D converted and the charging of the electric charges to the S/H circuit unit C1 is determined on the basis of the lower limit to detect disconnection will be described. The control unit 27B puts the input signal selection switch Fn in a non-conductive state, puts the amplifier switch GBn in a non-conductive state, puts the bypass switch GAn in a conductive state, and puts the discharge control switch Nn in a conductive state to discharge the electric charges charged to the parasitic capacitance unit 23 (capacitor PS1n) and the terminal S/H circuit unit 30 in a period PCD of FIG. 16 as shown in FIG. 18B. The control unit 27B puts each switch of the charge unit 21, the discharge switch D, the bypass switch HAn, and the S/H switch HBn in a non-conductive state. The period PCD corresponds to the discharging or charging period of the input signal line FTn as similar to the example and the first modified example. When the input terminal CHn is in a disconnection state, the electric charges are discharged from the parasitic capacitance unit 23 (capacitor PS1n) and the terminal S/H circuit unit 30 to discharge the electric charges from the input signal line FTn to the A/D conversion unit 26 when A/D conversion is performed. Accordingly, the comparison determination unit 29 determines that the A/D conversion result becomes around 0V, and the disconnection state is detected.

A case in which a signal of the input terminal CHn is not A/D converted and the charging of the electric charges to the S/H circuit unit C1 is determined on the basis of the upper limit to detect disconnection will be described. The control unit 27B puts the amplifier switch GBn in a non-conductive state, puts the bypass switch GAn in a conductive state, and puts the charge control switch Mn in a conductive state to charge the electric charges to the parasitic capacitance unit 23 (capacitor PS1n) and the terminal S/H circuit unit 30 in the period PCD of FIG. 16. The control unit 27B puts each switch of the discharge unit 28, the charge switch E, the bypass switch HAn, and the S/H switch HBn in a non-conductive state. When the input terminal CHn is in a disconnection state, the electric charges are charged to the parasitic capacitance unit 23 (capacitor PS1n) and the terminal S/H circuit unit 30 to charge the electric charges from the input signal line FTn to the A/D conversion unit 26 when A/D conversion is performed. Accordingly, the comparison determination unit 29 determines that the A/D conversion result becomes around a power supply voltage (for example, 5V), and the disconnection state is detected.

In each input channel, the period A, the period B, the period CD, the period PA, and the period PCD are periodically repeated in order. Further, the period A and the period B of each input channel are performed in parallel. Thereafter, the periods CD and the periods PA of the first input channel to the n-th input channel are sequentially performed.

In the second modified example, even when the terminal S/H circuit in consideration of motor control is provided in addition to the configuration of the A/D conversion circuit of the first modified example, the electric charges can be discharged or charged from the parasitic capacitance and the S/H circuit unit. Thus, disconnection can be detected during normal A/D conversion as similar to the first modified example. It should be noted that when the terminal S/H function (S/H circuit) is not used, the bypass switch HAn is put in a conductive state and the S/H switch HBn is put in a non-conductive state. Accordingly, an operation similar to the first modified example can be performed.

Third Modified Example

A configuration of an A/D conversion circuit according to a third modified example of the example will be described using FIGS. 19 to 21. The third modified example has a circuit configuration in which the number of amplifying units is reduced from the signal transmission circuit of the first modified example and the amplifier is shared by a plurality of terminals.

Figure 19:
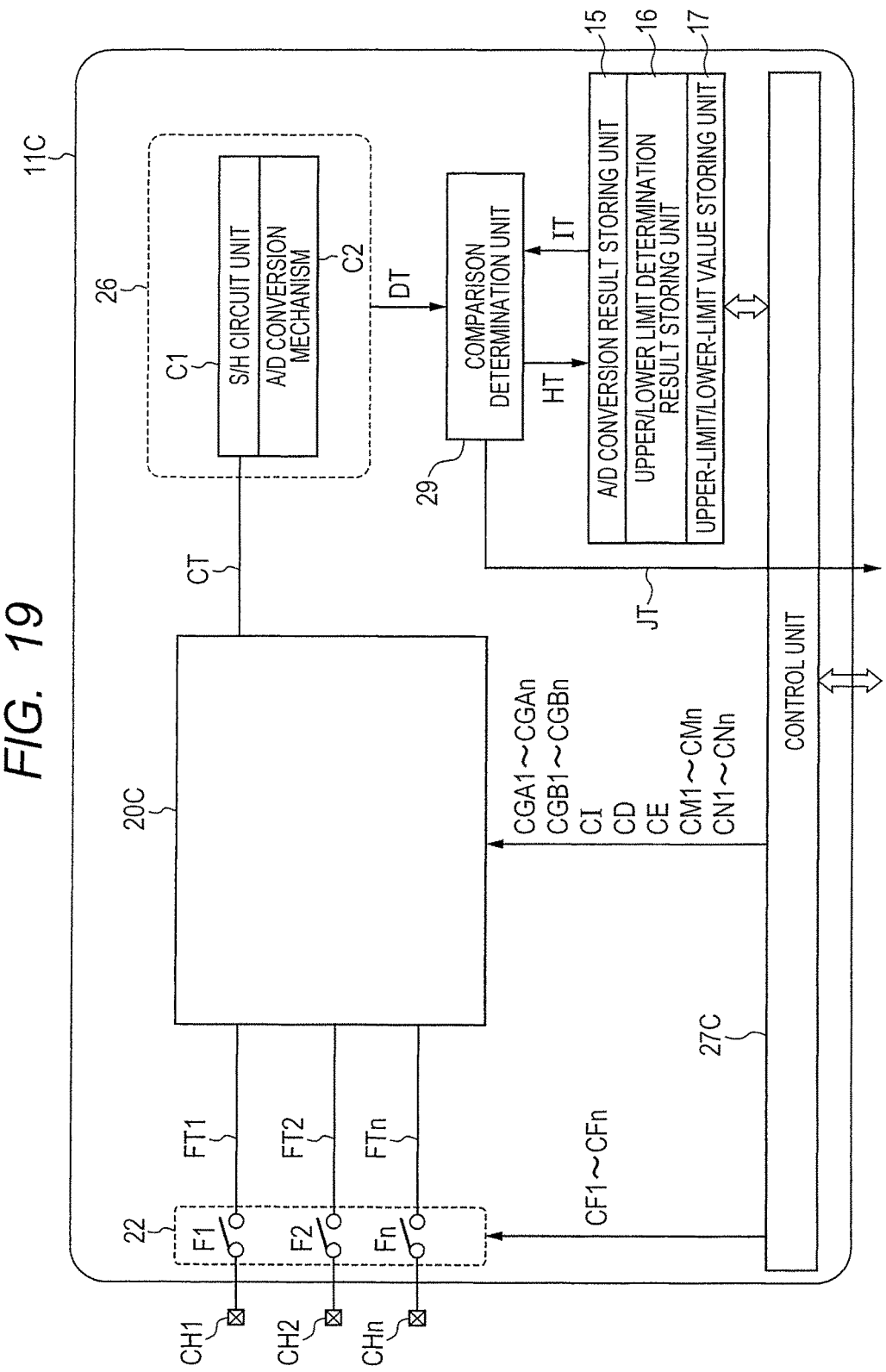
FIG. 19 is a block diagram for showing a configuration of an A/D conversion circuit according to a third modified example.

As shown in FIG. 19, an A/D conversion circuit 11C according to the third modified example has the same configuration as the example except for a signal transmission unit STUC, a charge unit 21C, a discharge unit 28C, and a control unit 27C. As shown in FIG. 20, the input unit 20C according to the third modified example is obtained by replacing the signal transmission unit STU of FIG. 3 with the signal transmission unit STUC of FIG. 21.

Figure 21:
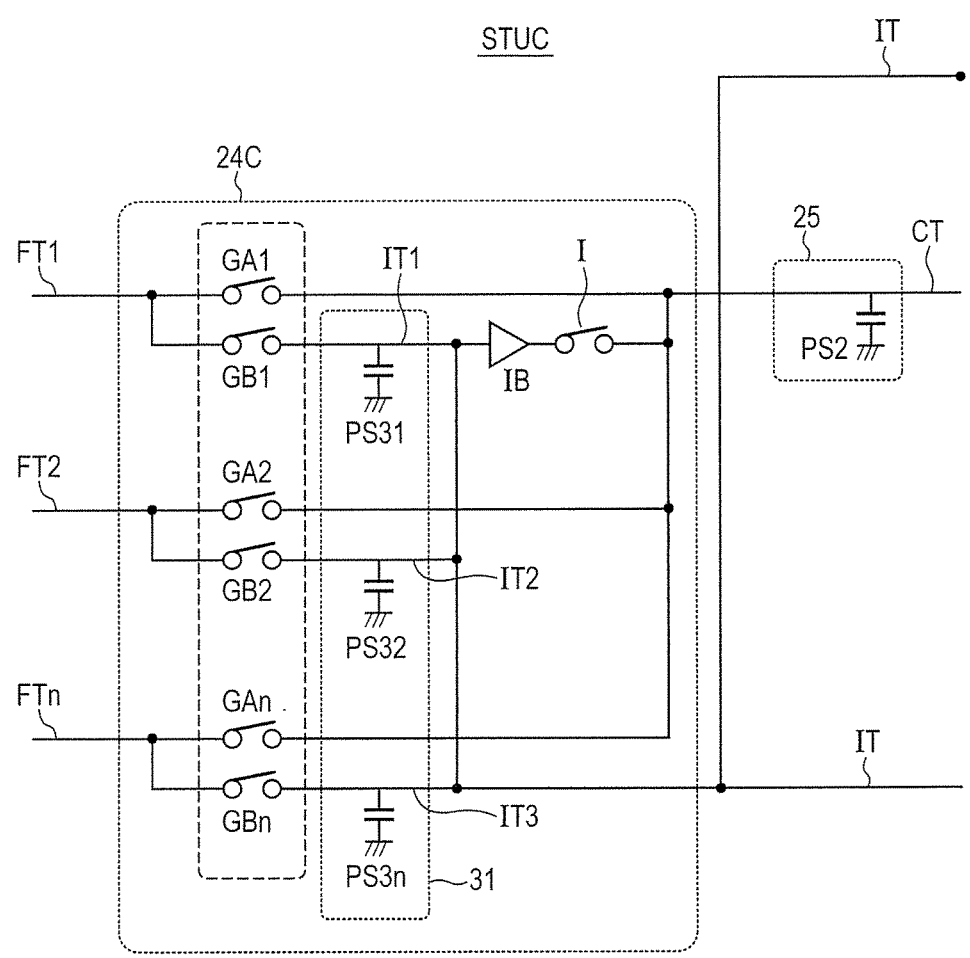
FIG. 21 is a circuit diagram for showing a configuration of a signal transmission unit of FIG. 20.

As shown in FIG. 21, the signal transmission unit STUC includes a bypass/amplifying unit 24C and a parasitic capacitance unit 25. The bypass/amplifying unit 24C has bypass switches GA1 to GAn that couple input signal lines FT1 to FTn to an output signal line CT not through a common amplifier IB, amplifier switches GB1 to GBn coupled to the common amplifier IB, a parasitic capacitance unit 31 of an intermediate signal line IT, and a common switch I that couples the output signal line CT to the common amplifier I. The parasitic capacitance unit 31 includes intermediate signal lines IT1 to ITn that couple the amplifier switches GB1 to GBn to the common amplifier IB, and capacitors PS31 to PS3$n$ that are parasitic capacitances between the amplifier switches GB1 to GBn and a grounding wire. Opening/closing of the bypass switches GA1 to GAn, the amplifier switches GB1 to GBn, and the common switch I are controlled by control signals (CGA1 to CGAn, CGB1 to CGBn, and CI) output from the control unit 27C. A route from the input terminal CHn to the output signal line CT through the input signal selection switch Fn, the input signal line FTn, and the bypass switch GAn (or the amplifier switch GBn, the common amplifier IB, and the common switch I) is referred to as an n-th input channel.

Figure 20:
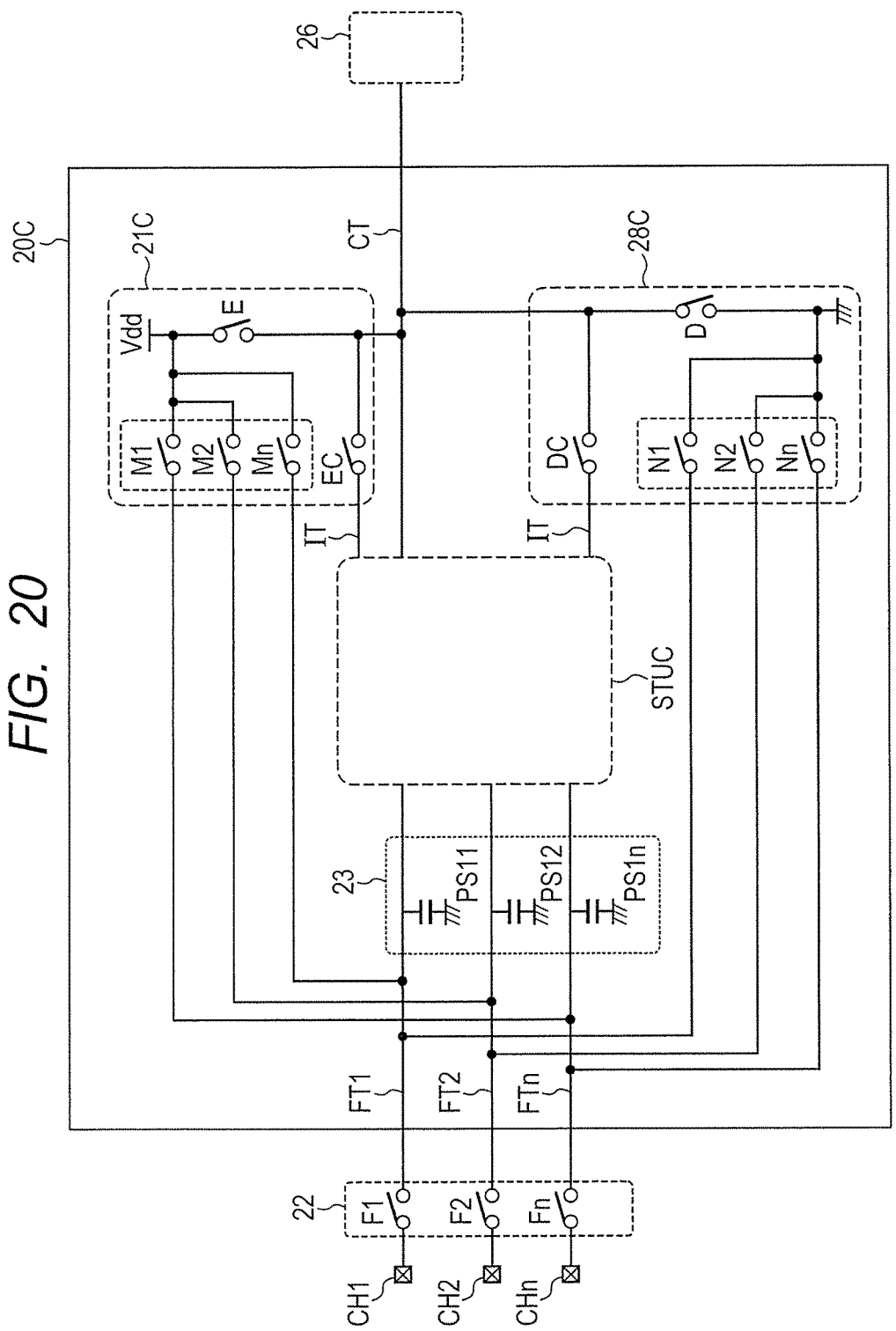
FIG. 20 is a circuit diagram for showing a configuration of an input unit of FIG. 19.

As shown in FIG. 20, a discharge switch DC provided in the discharge unit 28C couples the parasitic capacitance unit 31 to the grounding wire through the intermediate signal line IT. Further, a charge switch EC provided in the charge unit 21C couples the parasitic capacitance unit 31 to a power supply line (Vdd) through the intermediate signal line IT. Here, the intermediate signal line IT is a signal line to which the intermediate signal lines IT1 to ITn are coupled. Opening/closing of the discharge switch DC and the charge switch EC is controlled by control signals (CD and CE) output from the control unit 27C.

An operation of the A/D conversion circuit of FIG. 19 will be described using FIGS. 22, 23A, 23B, 24A, and 24B. As similar to the example, the switching control of the A/D conversion circuit differs depending on the input terminal (selected input channel) in which A/D conversion is performed and the input terminal (unselected input channel) in which A/D conversion is not performed. The input channels are the first input channel to the n-th input channel, but the n-th input channel will be described below as a representative channel.

Figure 24A:
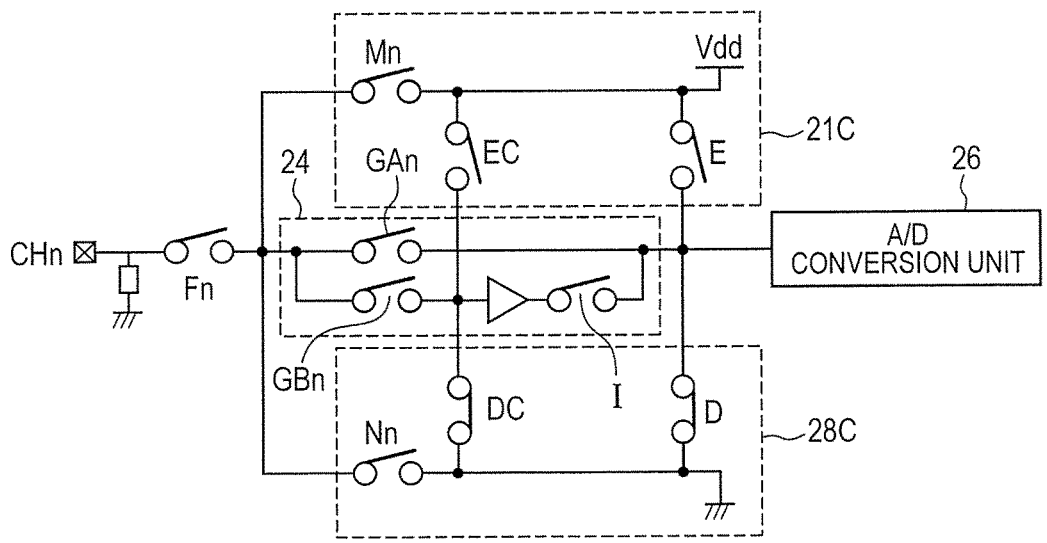
FIG. 24A is a diagram for explaining switch control of an unselected input channel (period CD) of FIG. 21.

When a signal of the input terminal CHn is A/D converted, the control unit 27C puts the input signal selection switch Fn in a conductive state, and puts the input signal selection switches other than the input signal selection switch Fn in a non-conductive state. In a period CD of FIG. 22, in order to suppress the influence of the electric charges when A/D conversion is performed at a different terminal before the electric charges of the signal generation source are charged to the S/H circuit unit C1, the control unit 27C puts the bypass switch GAn and the amplifier switch GBn in a non-conductive state, and puts the discharge switches D and DC in a conductive state before A/D conversion to discharge the electric charges from the S/H circuit unit C1 and the parasitic capacitance units 25A and 31 as shown in FIG. 24A. Namely, the control unit 27C puts the switches other than the discharge switches D and DC in a non-conductive state. A case in which the electric charges are discharged will be mainly described below. However, the same control is performed even in the case where the electric charges are charged. The period CD corresponds to the charging or discharging period of the S/H circuit unit C1 and the parasitic capacitance unit 31.

Figure 22:
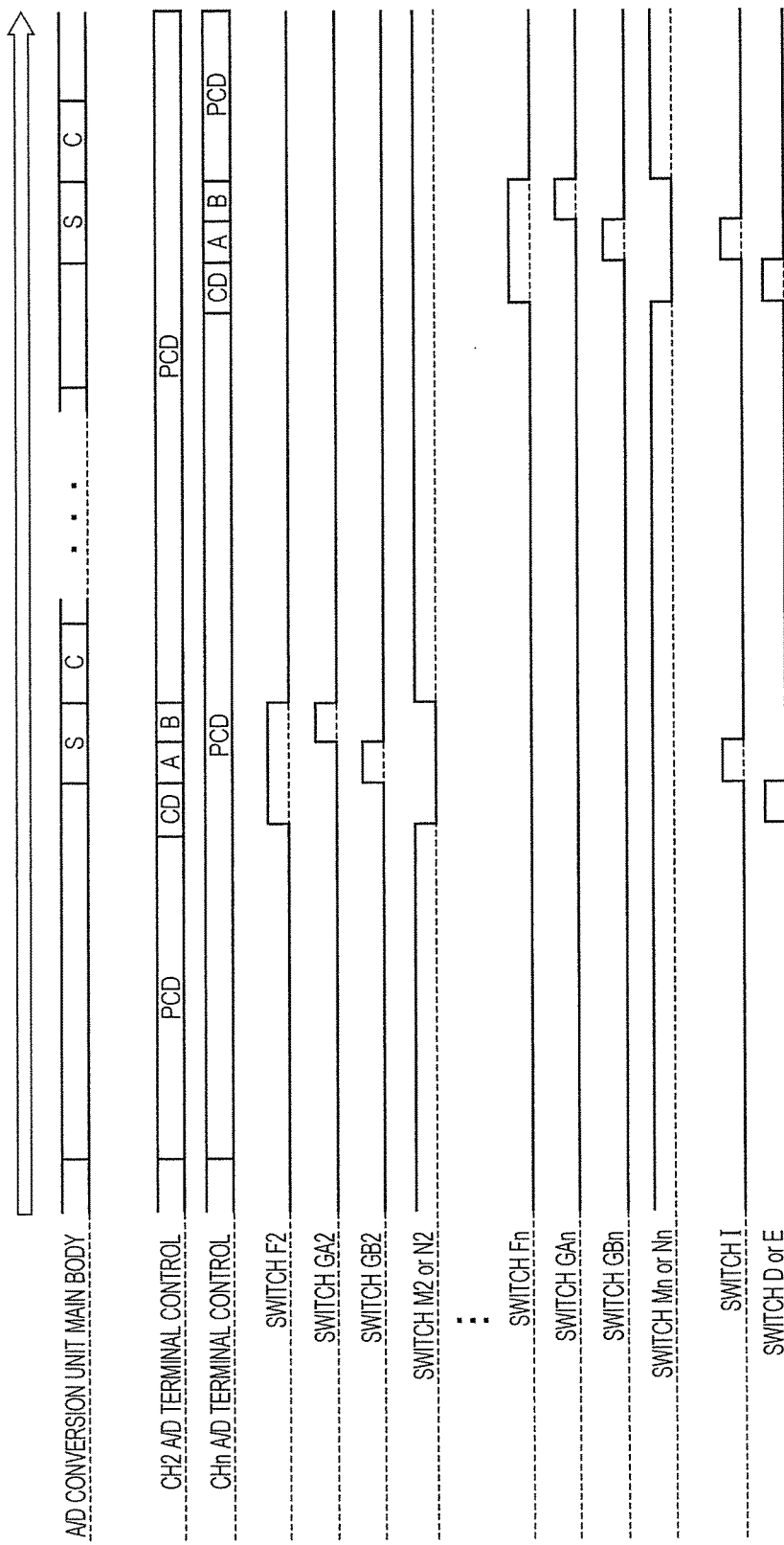
FIG. 22 is a timing diagram of the A/D conversion circuit of FIG. 19.
Figure 23A:
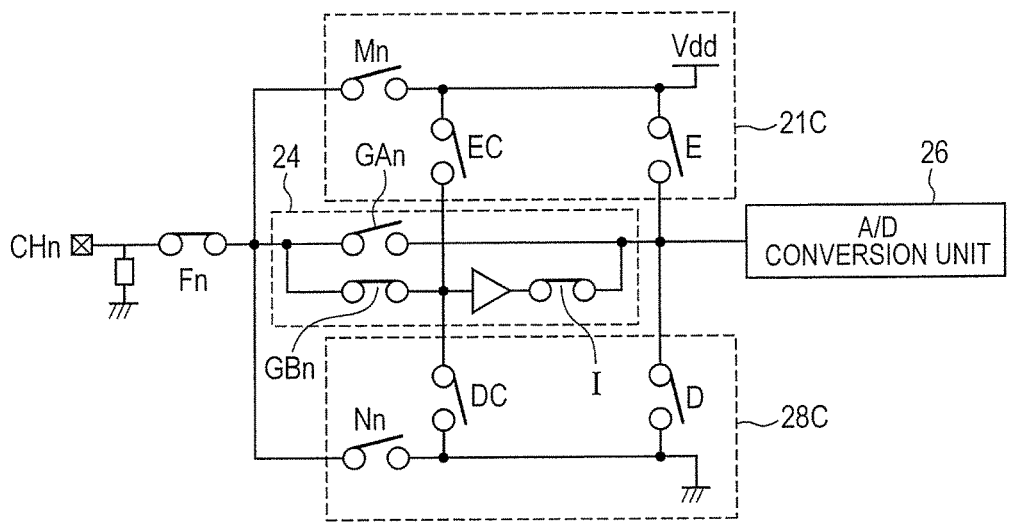
FIG. 23A is a diagram for explaining switch control of a selected input channel (period A) of FIG. 21.

In a period A of FIG. 22, after the electric charges are discharged from the S/H circuit unit C1, the control unit 27C puts the amplifier switch GBn and the common switch I in a conductive state to charge the electric charges of the signal generation source to the S/H circuit unit C1 using an output from the common amplifier IB as shown in FIG. 23A. The control unit 27C puts each switch of the charge unit 21 and the discharge unit 28C and the bypass switch GAn in a non-conductive state.

Figure 23B:
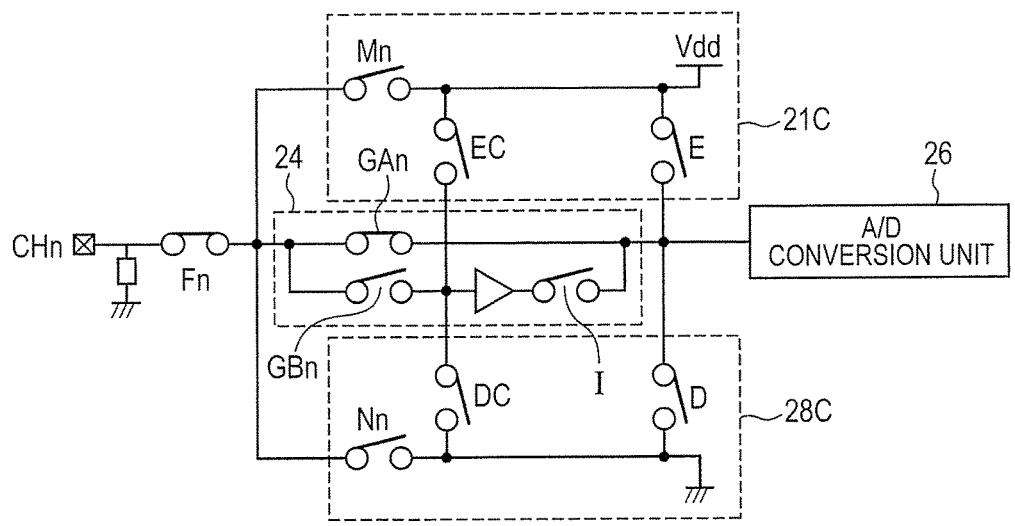
FIG. 23B is a diagram for explaining switch control of the selected input channel (period B) of FIG. 21.

In a period B of FIG. 22, in order to improve the accuracy of A/D conversion, the control unit 27C puts the amplifier switch GBn in a non-conductive state, and puts the bypass switch GAn in a conductive state to charge the electric charges of the signal generation source to the S/H circuit unit C1 as shown in FIG. 23B. The control unit 27C puts each switch of the charge unit 21C and the discharge unit 28C in a non-conductive state. The period A and the period B correspond to the sampling period of the S/H circuit unit C1 (period S). In a period C of FIG. 22, after the charging of the electric charges of the signal generation source to the S/H circuit unit C1 is completed, A/D conversion is performed by putting the bypass switch GAn in a non-conductive state. The period C corresponds to the conversion period of the A/D conversion unit 26.

Figure 24B:
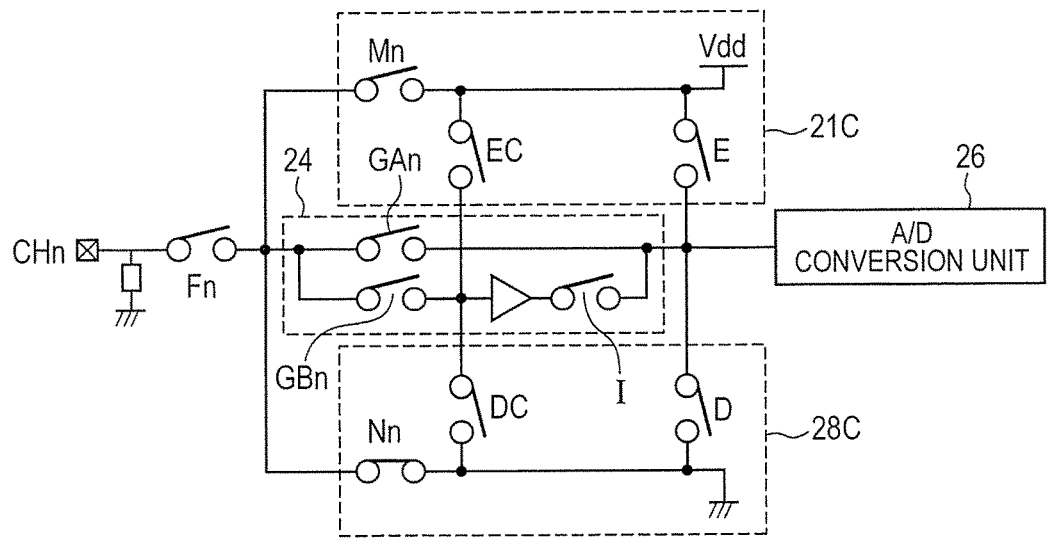
FIG. 24B is a diagram for explaining switch control of the unselected input channel (period PCD) of FIG. 21.

A case in which a signal of the input terminal CHn is not A/D converted and the charging of the electric charges to the S/H circuit unit C1 is determined on the basis of the lower limit to detect disconnection will be described. The control unit 27C puts the input signal selection switch Fn in a non-conductive state, puts the bypass switch GAn, the amplifier switch GBn, and the common switch I in a non-conductive state, and puts the discharge control switch Nn in a conductive state to discharge the electric charges charged to the parasitic capacitance unit 23 in a period PCD of FIG. 22 as shown in FIG. 24B. The control unit 27C puts each switch of the charge unit 21C and the discharge switch D in a non-conductive state. The period PCD corresponds to the discharging or charging period of the input signal line FTn. When the input terminal CHn is in a disconnection state, the electric charges are discharged from the parasitic capacitance unit 23 to discharge the electric charges from the input signal line FTn to the A/D conversion unit 26 when A/D conversion is performed. Accordingly, the comparison determination unit 29 determines that the A/D conversion result becomes around 0V, and the disconnection state is detected.

A case in which a signal of the input terminal CHn is not A/D converted and the charging of the electric charges to the S/H circuit unit C1 is determined on the basis of the upper limit to detect disconnection will be described. The control unit 27C puts the bypass switch GAn, the amplifier switch GBn, and the common switch I in a non-conductive state, and puts the charge control switch Mn in a conductive state to charge the electric charges to the parasitic capacitance unit 23 in the period PCD of FIG. 22. The control unit 27C puts each switch of the discharge unit 28C and the charge switch E in a non-conductive state. When the input terminal CHn is in a disconnection state, the electric charges are charged to the parasitic capacitance unit 23 to charge the electric charges from the input signal line FTn to the A/D conversion unit 26 when A/D conversion is performed. Accordingly, the comparison determination unit 29 determines that the A/D conversion result becomes around a power supply voltage (for example, 5V), and the disconnection state is detected.

In each input channel, the period CD, the period A, the period B, and the period PCD are periodically repeated in order. The period CD, the period A, and the period B of one input channel are performed in parallel with the period PCD of a different input channel.

According to the third modified example, even in the circuit configuration in which the amplifier provided on a terminal basis is shared by a plurality of terminals, the electric charges can be discharged from the parasitic capacitance and the S/H circuit unit by the above-described additional circuit and the switching control or can be charged to the parasitic capacitance and the S/H circuit unit. Thus, disconnection can be detected during normal A/D conversion as similar to the first modified example, thereby leading to a contribution to downsizing of the chip size of the semiconductor device.

First Application

A configuration of a motor control system according to a first application will be described using FIG. 25. In the case where a three-phase motor 3 used for automobiles and industries is controlled by a microcontroller 1, the microcontroller 1 controls output values (a motor driving signal of a motor control timer 18 and an excitation waveform signal of an excitation signal generation timer 19) to the three-phase motor 3 according to a current value of each phase of the three-phase motor 3 from a driver/inverter/current detection circuit 2 and an output from a resolver 4. Because of the following reasons, the A/D conversion circuit 11B of the second modified example is used in the first application.

(1) In order to obtain the rotational angle and speed of the three-phase motor 3, the current value of each phase of the three-phase motor is sampled using a U-phase current value, a V-phase current value, and a W-phase current value from a current detection circuit 2. However, an output of the current of each phase is sequentially changed depending on time. It is necessary to simultaneously obtain the current value of each phase to accurately control the three-phase motor 3, and thus the terminal S/H circuit (S&H) is used.

(2) The resolver 4 is used to obtain the rotational angle of the three-phase motor 3. An excitation waveform signal is output from the excitation signal generation timer of the microcontroller 1 to the resolver 4, and analog values of a Sin waveform signal and a Cos waveform signal are output from the resolver 4 to the A/D conversion circuit 11B of the microcontroller 1. In order to detect the rotational angle on the basis of the phase difference between the Sin waveform signal and the Cos waveform signal from the resolver 4, the analog values need to be simultaneously held, and thus the terminal S/H circuit (S&H) is used.

Second Application

A configuration of an air-bag system according to a second application will be described using FIG. 26. An air-bag of an automobile determines a collision of the vehicle using the microcontroller 1 on the basis of signals from various sensors (a G sensor 7, a yaw rate sensor 8, and the like). The signals from the sensors are analog signals. Thus, when the signals are received by the microcontroller 1, the signals are converted to digital signals by the A/D conversion circuit 11. It is not necessary to simultaneously fetch the signals of various sensors in the second application. Thus, the A/D conversion circuits 11, 11A, and 11C of the example and the first and third modified examples are used.

The invention achieved by the inventors has been described above in detail on the basis of the embodiment, the example, and the applications. However, it is obvious that the present invention is not limited to the embodiment, the example, and the applications, but can be variously changed.

What is claimed is:

1. A semiconductor device comprising:
   a first input terminal;
   a second input terminal;
   an A/D conversion unit having a sample hold circuit;
   a first input channel that couples the first input terminal and the A/D conversion unit to each other;
   a second input channel that couples the second input terminal and the A/D conversion unit to each other; and
   a control unit that provides:
   in a first period, a first set of signals to enable electrical connection between the first input terminal and the A/D conversion unit through the first input channel, such that a signal input into the first input terminal is sampled by the sample hold circuit,
   in a second period, a second set of signals to disenable electrical connection between the second input terminal and the A/D conversion unit through the second input channel, and
   in a third period, a third set of signals to enable charging or discharging of the second input channel,
   wherein a portion of the first period, a portion of the second period, and a portion of the third period overlap with each other.

2. The semiconductor device according to claim 1, further comprising:
an output signal line that couples an output of the first input channel, an output of the second input channel, and an input of the sample hold circuit to each other;
a charge unit that charges the output signal line; and
a discharge unit that discharges the output signal line.

3. The semiconductor device according to claim 2, wherein the first input channel includes:
a first input signal selection switch that is controlled at least by one of the first set of signals and couples the first input terminal to a first input signal line of the first input channel; and
a first switch that is controlled at least by another of the first set of signals and couples the first input signal line to the output signal line, and
wherein the second input channel includes:
a second input signal selection switch that is controlled at least by one of the second set of signals and couples the second input terminal to a second input signal line of the second input channel; and
a second switch that is controlled at least by another of the second set of signals and couples the second input signal line to the output signal line.

4. The semiconductor device according to claim 3, wherein the charge unit includes:
a first charge switch that couples a power supply line to the output signal line;
a first charge control switch that couples the power supply line to the first input signal line; and
a second charge control switch that couples the power supply line to the second input signal line, and
wherein the discharge unit includes:
a first discharge switch that couples a grounding wire to the output signal line;
a first discharge control switch that couples the grounding wire to the first input signal line; and
a second discharge control switch that couples the grounding wire to the second input signal line.

5. The semiconductor device according to claim 3, wherein the first input channel further includes:
a first amplifier that is coupled to one end of the first switch; and
a first amplifier switch that couples an output of the first amplifier to the other end of the first switch, and
wherein the second input channel further includes:
a second amplifier that is coupled to one end of the second switch; and
a second amplifier switch that couples an output of the second amplifier to the other end of the second switch.

6. The semiconductor device according to claim 3, wherein the first input channel further includes:
a first bypass switch that couples the first switch to the output signal line;
a first sample hold circuit that is coupled to one end of the first bypass switch; and
a first sample hold switch that couples an output of the first sample hold circuit to the other end of the first bypass switch, and
wherein the second input channel further includes:
a second bypass switch that couples the second switch to the output signal line;
a second sample hold circuit that is coupled to one end of the second bypass switch; and
a second sample hold switch that couples an output of the second sample hold circuit to the other end of the second bypass switch.

7. The semiconductor device according to claim 3, further comprising:
a first amplifier switch that couples the first input signal line to an intermediate signal line;
a second amplifier switch that couples the second input signal line to the intermediate signal line;
a common amplifier that is coupled to the intermediate signal line; and
a common switch that couples the common amplifier to the output signal line.

8. The semiconductor device according to claim 7, further comprising:
a second charge switch that couples a power supply line to the intermediate signal line; and
a second discharge switch that couples a grounding wire to the intermediate signal line.

9. The semiconductor device according to claim 1, further comprising a determination unit that determines disconnection by comparing a conversion result of the A/D conversion unit with a predetermined value.

10. The semiconductor device according to claim 9, further comprising:
a register that stores the predetermined value; and
a CPU that sets the predetermined value to the register.

11. A semiconductor device comprising:
a first input tell terminal;
a first input signal selection switch that is coupled to the first input terminal;
a first input signal line that is coupled to the first input signal selection switch;
an input unit that is coupled to the first input signal line;
an output signal line that is coupled to the input unit; and
an A/D conversion unit that is coupled to the output signal line,
wherein the input unit includes:
a first parasitic capacitor that is coupled to the first input signal line;
a first charge control switch that couples a power supply line to the first input signal line;
a first discharge control switch that couples a grounding wire to the first input signal line;
a first switch that couples the output signal line to the first input signal line;
a common parasitic capacitance capacitor that is coupled to the output signal line;
a charge switch that couples the power supply line to the output signal line; and
a discharge switch that couples the grounding wire to the output signal line.

12. The semiconductor device according to claim 11, wherein the input unit further includes:
a second input terminal;
a second input signal selection switch that is coupled to the second input terminal;
a second input signal line that is coupled to the second input signal selection switch;
a second parasitic capacitor that is coupled to the second input signal line;
a second charge control switch that couples the power supply line to the second input signal line;
a second discharge control switch that couples the grounding wire to the second input signal line; and
a second switch that couples the output signal line to the second input signal line.

13. The semiconductor device according to claim 12, wherein the input unit further includes:
a first amplifier that is coupled to one end of the first switch;
a first amplifier switch that couples an output of the first amplifier to the other end of the first switch;
a second amplifier that is coupled to one end of the second switch; and
a second amplifier switch that couples an output of the second amplifier to the other end of the second switch.

14. The semiconductor device according to claim 13, wherein the input unit further includes:
a first bypass switch that couples the first switch to the output signal line;
a first sample hold circuit that is coupled to one end of the first bypass switch;
a first sample hold switch that couples an output of the first sample hold circuit to the other end of the first bypass switch;
a second bypass switch that couples the second switch to the output signal line;
a second sample hold circuit that is coupled to one end of the second bypass switch; and
a second sample hold switch that couples an output of the second sample hold circuit to the other end of the second bypass switch.

15. The semiconductor device according to claim 13, wherein the input unit further includes:
a first amplifier switch that couples the first input signal line to an intermediate signal line;
a second amplifier switch that couples the second input signal line to the intermediate signal line;
a common amplifier that is coupled to the intermediate signal line; and
a common switch that couples the common amplifier to the output signal line.

16. The semiconductor device according to claim 15, wherein the input unit further includes:
a second charge switch that couples a power supply line to the intermediate signal line; and
a second discharge switch that couples a grounding wire to the intermediate signal line.

17. The semiconductor device according to claim 11, further comprising a determination unit that determines disconnection by comparing a conversion result of the A/D conversion unit with a predetermined value.

18. The semiconductor device according to claim 17, further comprising:
a register that stores the predetermined value; and
a CPU that sets the predetermined value to the register.

* * * * *